(12) United States Patent
Lee et al.

(10) Patent No.: US 10,957,645 B1
(45) Date of Patent: Mar. 23, 2021

(54) PACKAGE STRUCTURE HAVING CONDUCTIVE PATTERNS WITH CRYSTAL GRAINS COPPER COLUMNAR SHAPE AND METHOD MANUFACTURING THE SAME

(71) Applicant: Taiwan Semiconductor Manufacturing Co., Ltd., Hsinchu (TW)

(72) Inventors: Yu-Ming Lee, New Taipei (TW); Chiang-Hao Lee, Changhua County (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/572,609

(22) Filed: Sep. 17, 2019

(51) Int. Cl.
| | | |
|---|---|---|
| H01L 23/48 | (2006.01) | |
| H01L 21/4763 | (2006.01) | |
| H01L 23/532 | (2006.01) | |
| H01L 23/00 | (2006.01) | |
| H01L 21/768 | (2006.01) | |
| H01L 21/56 | (2006.01) | |
| H01L 23/31 | (2006.01) | |
| H01L 21/02 | (2006.01) | |
| H01L 23/522 | (2006.01) | |
| H01L 23/528 | (2006.01) | |

(52) U.S. Cl.
CPC .. *H01L 23/53238* (2013.01); *H01L 21/02516* (2013.01); *H01L 21/565* (2013.01); *H01L 21/76873* (2013.01); *H01L 23/3157* (2013.01); *H01L 23/5226* (2013.01); *H01L 23/5283* (2013.01); *H01L 24/09* (2013.01); *H01L 2224/02331* (2013.01); *H01L 2224/02372* (2013.01)

(58) Field of Classification Search
CPC ... H01L 24/05; H01L 24/06; H01L 23/53238; H01L 23/5226; H01L 23/5283; H01L 24/09; H01L 21/02516; H01L 21/565; H01L 21/76873
See application file for complete search history.

(56) References Cited

U.S. PATENT DOCUMENTS

| | | | |
|---|---|---|---|
| 7,531,442 B2 * | 5/2009 | Pallinti | H01L 21/76801 438/613 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |

(Continued)

*Primary Examiner* — Alonzo Chambliss
(74) *Attorney, Agent, or Firm* — JCIPRNET

(57) ABSTRACT

A package structure includes a semiconductor die and a redistribution circuit structure. The redistribution circuit structure is disposed on and electrically connected to the semiconductor die and includes a metallization layer and a dielectric layer disposed on the metallization layer. The metallization layer has conductive patterns, where each of the conductive patterns includes crystal grains, the crystal grains each are in a column shape and include a plurality of first banded structures having copper atoms oriented on a (220) lattice plane.

20 Claims, 21 Drawing Sheets

(56) References Cited

U.S. PATENT DOCUMENTS

| | | |
|---|---|---|
| 9,372,206 B2 | 6/2016 | Wu et al. |
| 9,496,189 B2 | 11/2016 | Yu et al. |
| 2013/0206225 A1* | 8/2013 | Zinn ................. H01L 31/02167 |
| | | 136/256 |
| 2017/0256498 A1* | 9/2017 | Standaert .......... H01L 23/53238 |

* cited by examiner

PACKAGE STRUCTURE HAVING CONDUCTIVE PATTERNS WITH CRYSTAL GRAINS COPPER COLUMNAR SHAPE AND METHOD MANUFACTURING THE SAME

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging (e.g. formation of redistribution circuit structure/layer). In addition, such packages may further be integrated to a semiconductor substrate or carrier after dicing. Therefore, the reliability of the electrical performance within an internal component (e.g. a redistribution circuit structure) within each package becomes important.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
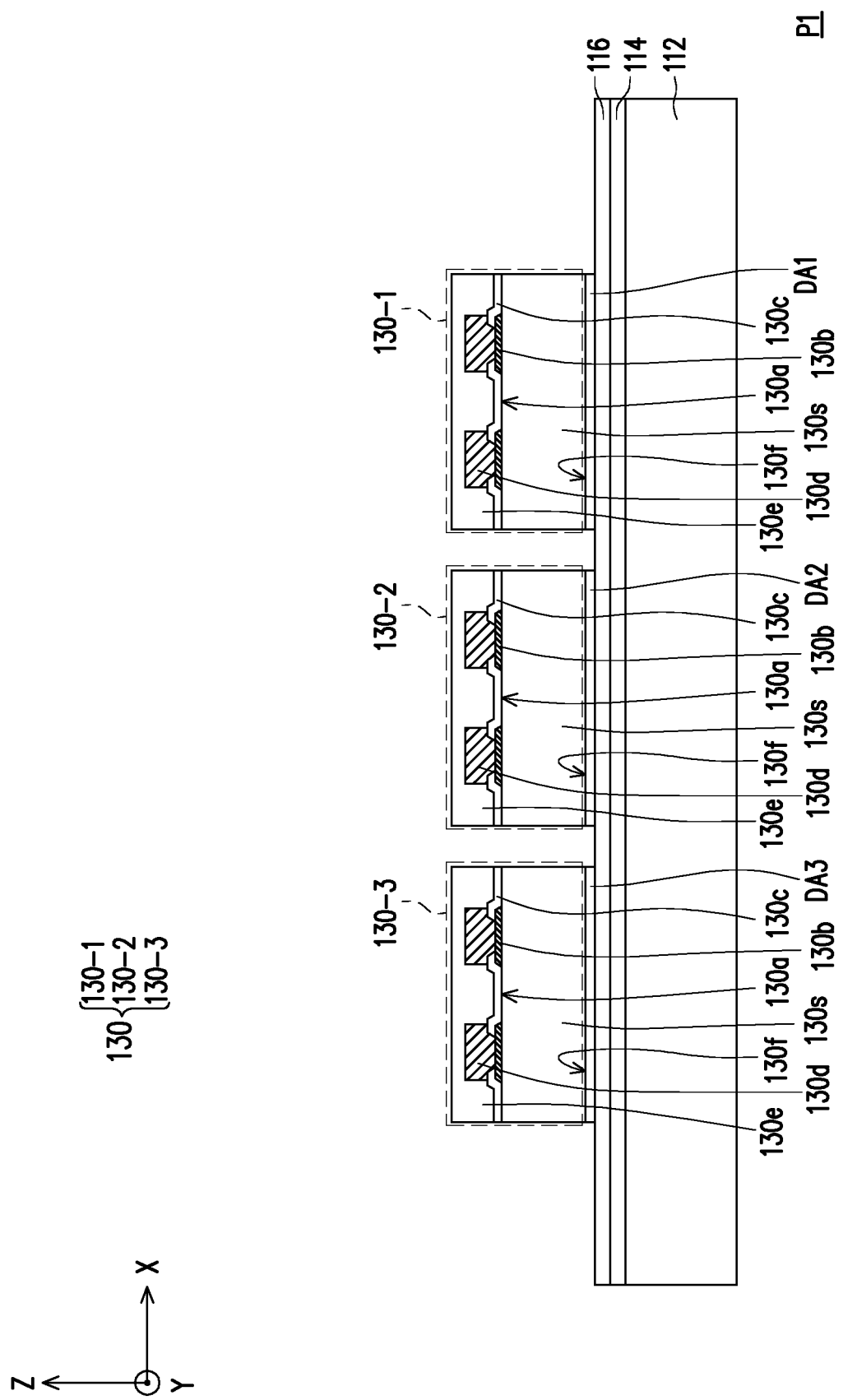
FIG. 1 to FIG. 6 and FIG. 8 to FIG. 15 are schematic cross-sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "over", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3 DIC devices. The testing structures may include, for example, test pads formed in a redistribution layer or on a substrate that allows the testing of the 3D packaging or 3 DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 6 and FIG. 8 to FIG. 15 are schematic cross-sectional views of various stages in a manufacturing method of a package structure in accordance with some embodiments of the disclosure. FIG. 7A is an enlarged, schematic cross-sectional view of a portion of a conductive pattern depicted in FIG. 6. FIG. 7B is an enlarged, schematic top view of a portion of a conductive pattern depicted in FIG. 6. In some embodiments, the manufacturing method is part of a packaging process. In FIG. 1 to FIG. 6 and FIG. 8 to FIG. FIG. 15, more than one (semiconductor) chips or dies are shown to represent plural (semiconductor) chips or dies of the wafer, and one (semiconductor) package structure is shown to represent plural (semiconductor) package structures obtained following the (semiconductor) manufacturing method, however the disclosure is not limited thereto. In other embodiments, one or more than one (semiconductor) chips or dies are shown to represent plural (semiconductor) chips or dies of the wafer, and one or more than one (semiconductor) package structure are shown to represent plural (semiconductor) package structures obtained following the (semiconductor) manufacturing method, however the disclosure is not limited thereto.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package. In some embodiments, the debond layer 114 is disposed on the carrier 112, and the material of the debond layer 114 may be any material suitable for bonding and debonding the carrier 112 from the above layer(s) (e.g. the buffer layer 116 depicted in FIG. 1) or bonding and debonding any wafer(s) (e.g. the carrier 112 depicted in FIG. 1) disposed thereon. In some embodiments, the debond layer 114 may include a release layer (such as a light-to-heat conversion ("LTHC") layer) or an adhesive layer (such as an ultra-violet curable adhesive or a heat curable adhesive layer).

As shown in FIG. 1, in some embodiments, the buffer layer 116 is disposed on the debond layer 114, and the debond layer 114 is located between the carrier 112 and the buffer layer 116. In some embodiments, the buffer layer 116 may be a dielectric material layer. In some embodiments, the buffer layer 116 may be a polymer layer which made of polyimide (PI), polybenzoxazole (PBO), benzocyclobutene (BCB), or any other suitable polymer-based dielectric material. In some embodiments, the buffer layer 116 may be Ajinomoto buildup film (ABF), solder resist film (SR), or the like. The top surface of the buffer layer 116 may be levelled and may have a high degree of coplanarity. However, the disclosure is not limited thereto; in other embodiments, the buffer layer 116 may be omitted.

For example, the debond layer 114 and the buffer layer 116 may be formed by a suitable fabrication technique such as spin-coating, lamination, deposition, or the like. The disclosure is not specifically limited thereto.

In some embodiments, at least one semiconductor die is disposed on the carrier 112. As illustrated in FIG. 1, in some embodiments, the at least one semiconductor die includes a plurality of semiconductor dies, such as a semiconductor die 130-1, a semiconductor die 130-2, and a semiconductor die 130-3. In the disclosure, the semiconductor dies 130-1, 130-2, 130-3 are referred to as semiconductor dies 130. As shown in FIG. 1, only three semiconductor dies 130 (e.g., the semiconductor dies 130-1, 130-2, 130-3) are presented for illustrative purposes, however, it should be noted that the number of the semiconductor dies 130 may be one or more than one, the disclosure is not limited thereto.

In some embodiments, the semiconductor dies 130 are picked and placed over the carrier 112 and disposed on the buffer layer 116. For example, as shown in FIG. 1, the semiconductor dies 130-1, 130-2, 130-3 are arranged aside to each other along a direction X, and the direction X is perpendicular to a stacking direction Z of the carrier 112, the debond layer 114, the buffer layer 116, and the semiconductor dies 130-1, 130-2, 130-3. In other embodiments, the semiconductor dies 130-1, 130-2, 130-3 are arranged aside to each other along a direction Y, and the direction Y is different from the direction X and the stacking direction Z, and is perpendicular to the stacking direction Z.

In some embodiments, the semiconductor dies 130-1, 130-2, 130-3 each include a semiconductor substrate 130s having an active surface 130a and a backside surface 130f opposite to the active surface 130a, a plurality of pads 130b distributed on the active surface 130a, a passivation layer 130c covering the active surface 130a and a portion of the pads 130b, a plurality of conductive vias 130d connecting to the pads 130b exposing by the passivation layer 130c, and a protection layer 130e disposed on the conductive vias 130d. The pads 130b, the passivation layer 130c, the conductive vias 130d, and the protection layer 130e are formed on the semiconductor substrate 130s. The pads 130b are partially exposed by the passivation layer 130c, the conductive vias 130d are respectively disposed on and electrically connected to the pads 130b, and the protection layer 130e covers the passivation layer 130c exposed by the conductive vias 130d and the conductive vias 130d.

However, the disclosure may not be limited thereto. For example, the conductive vias 130d and the protection layer 130e may be omitted. In an alternative embodiment, the semiconductor dies 130-1, 130-2, 130-3 each may include the semiconductor substrate 130s having the active surface 130a and the backside surface 130f opposite to the active surface 130a, the plurality of pads 130b distributed on the active surface 130a, and the passivation layer 130c covering the active surface 130a and a portion of the pads 130b.

The material of the semiconductor substrate 130s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 130s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 130s may further include an interconnection structure (not shown) disposed on the active surface 130a. In certain embodiments, the interconnection structure may include one or more inter-dielectric layers and one or more patterned conductive layers stacked alternately for providing routing function to the active components and the passive components embedded in the semiconductor substrate 130s, where the pads 130b may be referred to as an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The pads 130b are aluminum pads or other suitable metal pads, for example. The conductive vias 130d are copper pillars, copper alloy pillar or other suitable metal pillars containing copper metal, for example. In some embodiments, the passivation layer 130c and the protection layer 130e may be a PBO layer, a PI layer or other suitable polymers. In some alternative embodiments, the passivation layer 130c and the protection layer 130e may be made of inorganic materials, such as silicon oxide, silicon nitride, silicon oxynitride, or any suitable dielectric material. The material of the passivation layer 130c can be the same or different from the material of the protection layer 130e, for example.

It is noted that, the at least one semiconductor die, such as the semiconductor dies 130 (e.g. the semiconductor die 130-1, the semiconductor die 130-2 and the semiconductor die 130-3), described herein may be referred to as a semiconductor chip or an integrated circuit (IC). In an alternative embodiment, the semiconductor dies 130-1, 130-2, 130-3 described herein may be semiconductor devices. In certain embodiments, the semiconductor dies 130-1, 130-2, 130-3 may include one or more digital chips, analog chips or mixed signal chips, such as application-specific integrated circuit ("ASIC") chips, sensor chips, wireless and radio frequency (RF) chips, memory chips, logic chips or voltage regulator chips.

In certain embodiments, the at least one semiconductor die described herein, except for the semiconductor dies 130 (e.g. the semiconductor die 130-1, the semiconductor die 130-2 and the semiconductor die 130-3), may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto.

In the disclosure, it should be appreciated that the illustration of the semiconductor dies 130 (e.g. the semiconductor dies 130-1, 130-2, 130-3) and other components throughout all figures is schematic and is not in scale. In one embodiment, at least two of the semiconductor dies 130 (e.g. the semiconductor dies 130-1, 130-2, 130-3) may be the same. In an alternative embodiment, at least two of the semiconductor dies 130 (e.g. the semiconductor dies 130-1, 130-2, 130-3) may be different from each other.

Continued on FIG. 1, in some embodiments, the semiconductor dies 130 (e.g. the semiconductor dies 130-1, 130-2, 130-3) are respectively disposed on the buffer layer 116 with connecting films DA1, DA2, DA3. In other words, the backside surface 130f of each of the semiconductor die 130-1, the semiconductor die 130-2 and the semiconductor die 130-3 are respectively adhered to the buffer layer 116 by the connecting film DA1, the connecting film DA2 and the connecting film DA3. That is, the connecting film DA1 is sandwiched between the backside surface 130f of the semiconductor die 130-1 and the buffer layer 116, the connecting film DA2 is sandwiched between the backside surface 130f of the semiconductor die 130-2 and the buffer layer 116, and the connecting film DA3 is sandwiched between the backside surface 130f of the semiconductor die 130-3 and the buffer layer 116. Owing to the connecting films DA1, DA2, DA3, the semiconductor dies 130-1, 130-2, 130-3 are stably adhered to the buffer layer 116. In some embodiments, the connecting films DA1, DA2, DA3 may be, but not limited to, a die attach film or a layer made of adhesives, epoxy-based resin, acrylic polymer, other suitable insulating material, or the like, and which may be with or without fillers filled therein (such as silica, alumina, or the like). In alternative embodiments, the connecting films DA1, DA2, DA3 may be omitted, the disclosure is not limited thereto.

In other embodiments of which the buffer layer 116 is omitted as mentioned above, each of the semiconductor dies 130 (e.g. the semiconductor dies 130-1, 130-2, 130-3) is then disposed on the debond layer 114 through the connecting films DA1, DA2, DA3, respectively. In further other embodiments of which the connecting films DA1, DA2, DA3 are omitted as mentioned above, each of the semiconductor dies 130 (e.g. the semiconductor dies 130-1, 130-2, 130-3) is then disposed on the debond layer 114 through the buffer layer 116, respectively.

Figure 2:
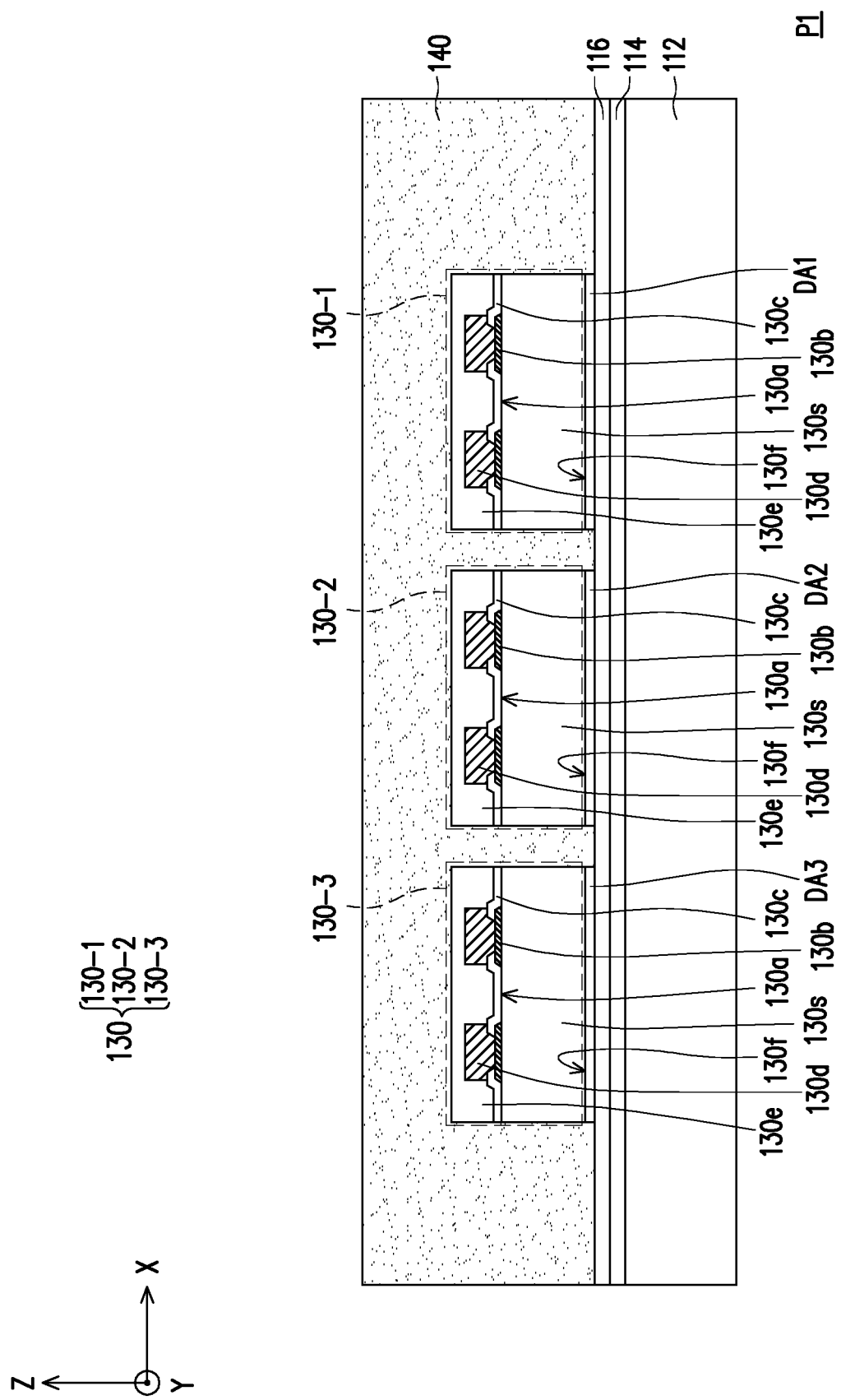

Referring to FIG. 2, in some embodiments, the semiconductor dies 130 are encapsulated in an insulating encapsulation 140. In some embodiments, the insulating encapsulation 140 is formed on the buffer layer 116 and over the carrier 112. As shown in FIG. 2, the insulating encapsulation 140 at least fills up the gaps between the semiconductor dies 130 (e.g. the semiconductor die 130-1, the semiconductor die 130-2 and the semiconductor die 130-3) and the gaps between the connecting films DA1, DA2, DA3, for example. In some embodiments, the insulating encapsulation 140 covers the semiconductor dies 130. In other words, for example, the semiconductor dies 130 are not accessibly revealed by and embedded in the insulating encapsulation 140.

In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 3:
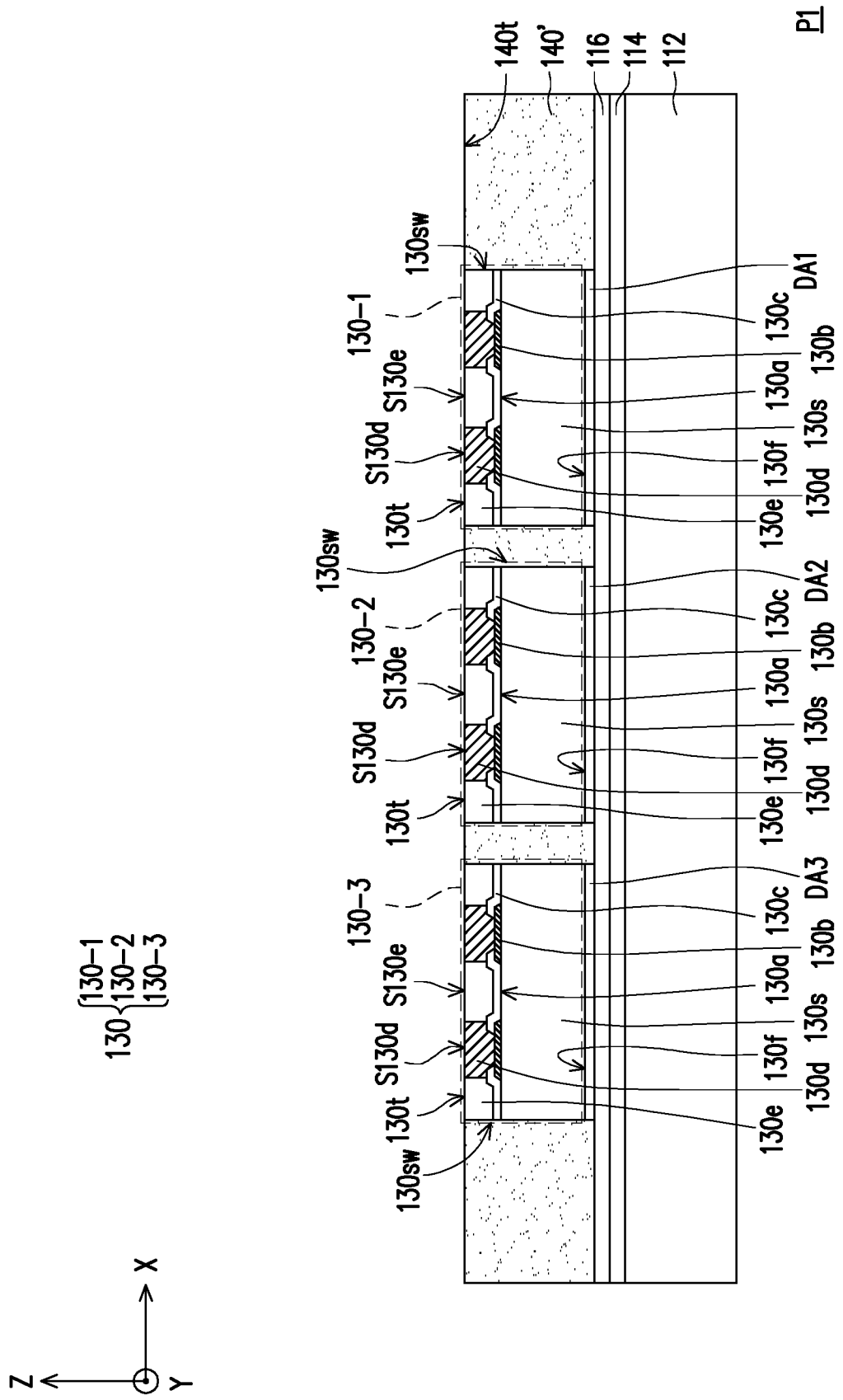

Referring to FIG. 3, in some embodiments, the insulating encapsulation 140 is planarized to form an insulating encapsulation 140' exposing the semiconductor dies 130. In certain embodiments, as shown in FIG. 3, after the planarization, top surfaces 130t of the semiconductor dies 130 (including top surfaces S130d of the conductive vias 130d and top surfaces S130e of the protection layer 130e of each of the semiconductor dies 130-1, 130-2, 130-3) are exposed by a top surface 140t of the insulating encapsulation 140'. That is, for example, the top surfaces 130t of the semiconductor dies 130 become substantially leveled with the top surface 140t of the insulating encapsulation 140'. In other words, the top surfaces 130t of the semiconductor dies 130 and the top surface 140t of the insulating encapsulation 140' are substantially coplanar to each other. In some embodiments, as shown in FIG. 3, the semiconductor dies 130 are accessibly revealed by the insulating encapsulation 140'. That is, for example, the conductive vias 130d of each of the semiconductor dies 130-1, 130-2, 130-3 are accessibly revealed by the insulating encapsulation 140'. In some embodiments, for example, sidewalls 130sw of the semiconductor dies 130 are also covered by the insulating encapsulation 140'.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive vias 130d and the protection layer 130e of the semiconductor dies 130-1, the semiconductor die 130-2, and/or the semiconductor die 130-3 may also be planarized. In certain embodiments, the planarizing step may be, for example, performed on the over-molded insulating encapsulation 140 to level the top surface 140t of the insulating encapsulation 140' and the top surfaces 130t of the semiconductor dies 130 (including the top surfaces S130d of the conductive vias 130d and the top surfaces S130e of the protection layer 130e of each of the semiconductor dies 130-1, 130-2, 130-3).

In some embodiments, a redistribution circuit structure 150 is formed on the semiconductor dies 130 and the insulating encapsulation 140'. In some embodiments, as shown in FIG. 4 to FIG. 12, the redistribution circuit structure 150 includes at least one dielectric layer 151 (e.g. a dielectric layer 151-1, a dielectric layer 151-2, a dielectric layer 151-3 and a dielectric layer 151-4), at least one seed layer 152 (e.g. a seed layer 152-1, a seed layer 152-2, a seed layer 152-3 and a seed layer 152-4), at least one seed layer 153 (e.g. a seed layer 153-1, a seed layer 153-2, a seed layer 153-3, and a seed layer 153-4), and at least one metallization layer 154 (e.g. a metallization layer 154-1, a metallization layer 154-2a, a metallization layer 154-2b, a metallization layer 154-3 and a metallization layer 154-4). However, in the disclosure, the numbers of layers of the dielectric layer 151, the seed layer 152, the seed layer 153, and the metallization layer 154 are not limited to what is depicted in FIG. 4 to FIG. 12, where the numbers of the layers of the dielectric layer 151, the seed layer 152, the seed layer 153 and the metallization layer 154 may be one or more than one.

Figure 4:
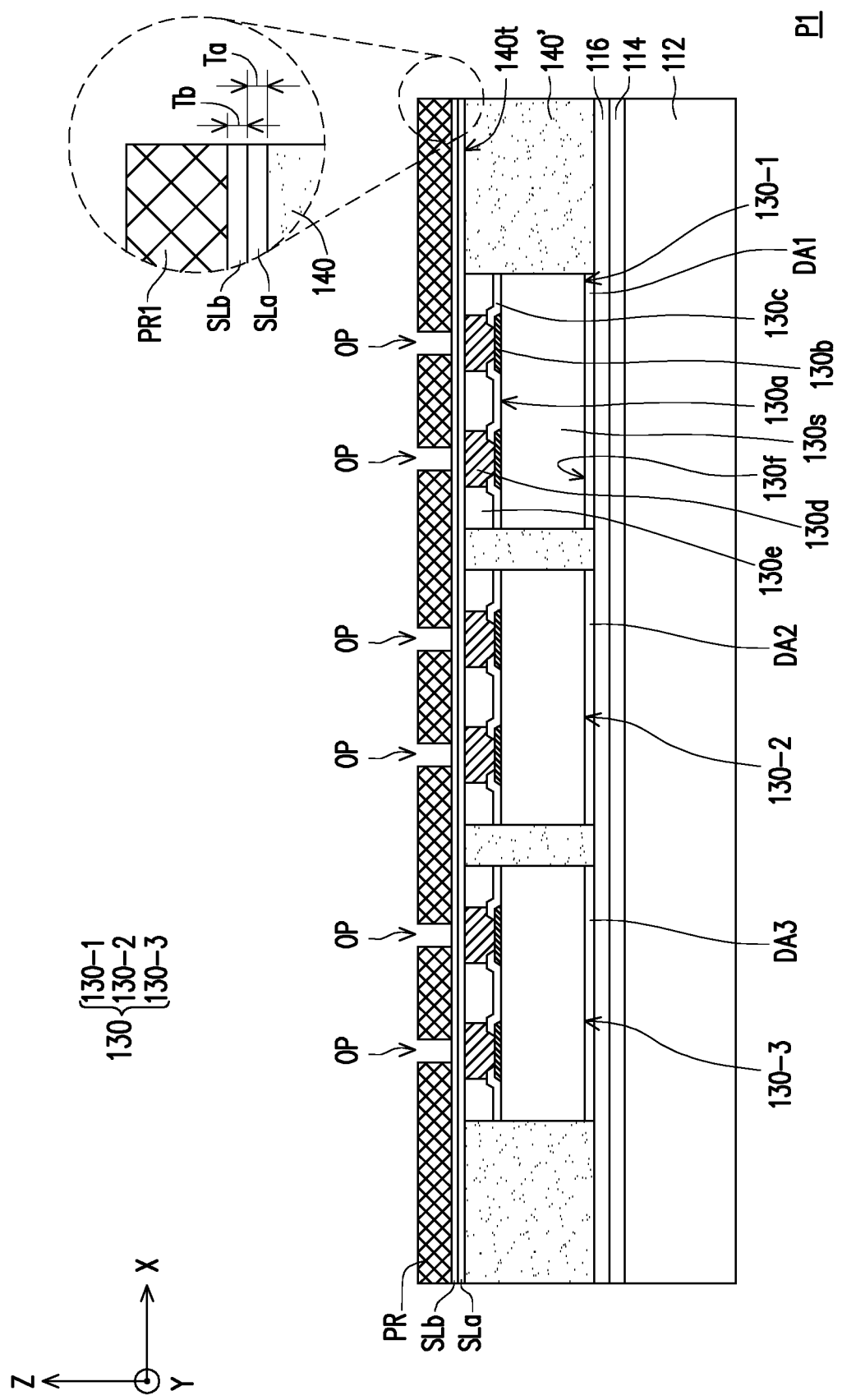

Referring to FIG. 4, in some embodiments, a seed layer SLa is formed on the semiconductor dies 130 and the insulating encapsulation 140'. For example, the seed layer SLa is formed on the semiconductor dies 130 and the insulating encapsulation 140' in a form of a blanket layer made of metal or metal alloy materials, the disclosure is not limited thereto. In the disclosure, the seed layer SLa is referred to as a metallic seed layer. In some embodiments, a material of the seed layer SLa may include titanium. The seed layer SLa may be formed using, for example, sputtering, physical vapor deposition (PVD), or the like. In some embodiments, a thickness Ta of the seed layer SLa is greater than 0 Å and is less than or substantially equal to 2 kÅ. In some embodiments, the seed layer SLa is conformally formed on the semiconductor dies 130 and the insulating encapsulation 140' as a thin layer composed of titanium. As shown in FIG. 4, in some embodiments, the seed layer SLa is in physical contact with the conductive vias 130d of the semiconductor dies 130 and the top surface 140t of the insulating encapsulation 140'.

Continued on FIG. 4, in some embodiments, a seed layer SLb is formed on the seed layer SLa. For example, the seed layer SLb is formed on the seed layer SLa in a form of a blanket layer made of metal or metal alloy materials, the disclosure is not limited thereto. In the disclosure, the seed layer SLb is referred to as a metallic seed layer. In some embodiments, a material of the seed layer SLb may include copper. The seed layer SLb may be formed using, for example, sputtering, PVD, or the like. In some embodiments, a thickness Tb of the seed layer SLb is greater than 0Å and is less than or substantially equal to 10 kÅ. In some embodiments, the seed layer SLb is conformally formed on the seed layer SLa as a thin layer composed of copper. As shown in FIG. 4, in some embodiments, the seed layer SLb is in physical contact with the seed layer SLa. That is, for example, the seed layer SLa is sandwiched between the insulating encapsulation 140' and the seed layer SLb and between the semiconductor dies 130 and the seed layer SLb.

In some embodiments, a sum of the thickness Ta of the seed layer SLa and the thickness Tb of the seed layer SLb is approximately ranging from 0.1 kÅ to 12 kÅ. In one embodiment, the thickness Tb of the seed layer SLb is greater than the thickness Ta of the seed layer SLa. In another embodiment, the thickness Tb of the seed layer SLb is substantially equal to the thickness Ta of the seed layer SLa. In other words, the thickness Ta of the seed layer SLa is less than the thickness Tb of the seed layer SLb.

As illustrated in FIG. 4, in some embodiments, a resist layer PR is formed on the seed layer SLb, where the resist layer PR includes at least one opening OP, for example. In some embodiments, as shown in FIG. 4, a plurality of openings OP are formed in the resist layer PR. As shown in FIG. 4, portions of the seed layer SLb are exposed by the openings OP formed in the resist layer PR, respectively. The number of the openings OP may, for example, correspond to the number of later-formed conductive structure(s) (such as a conductive pillar, a conductive via, a conductive trace, or a conductive segment). As shown in FIG. 4, for example, position locations of at least a portion of the openings OP are corresponding to (e.g. overlapped with) position locations of the conductive vias 130d of each of the semiconductor die 130-1, the semiconductor die 130-2 and the semiconductor die 130-3. In one embodiment, the resist layer PR may be formed by coating and photolithography processes or the like; however, the disclosure is not limited thereto. In some embodiments, a material of the resist layer PR, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the resist layer PR is referred to as a photoresist layer.

Figure 5:
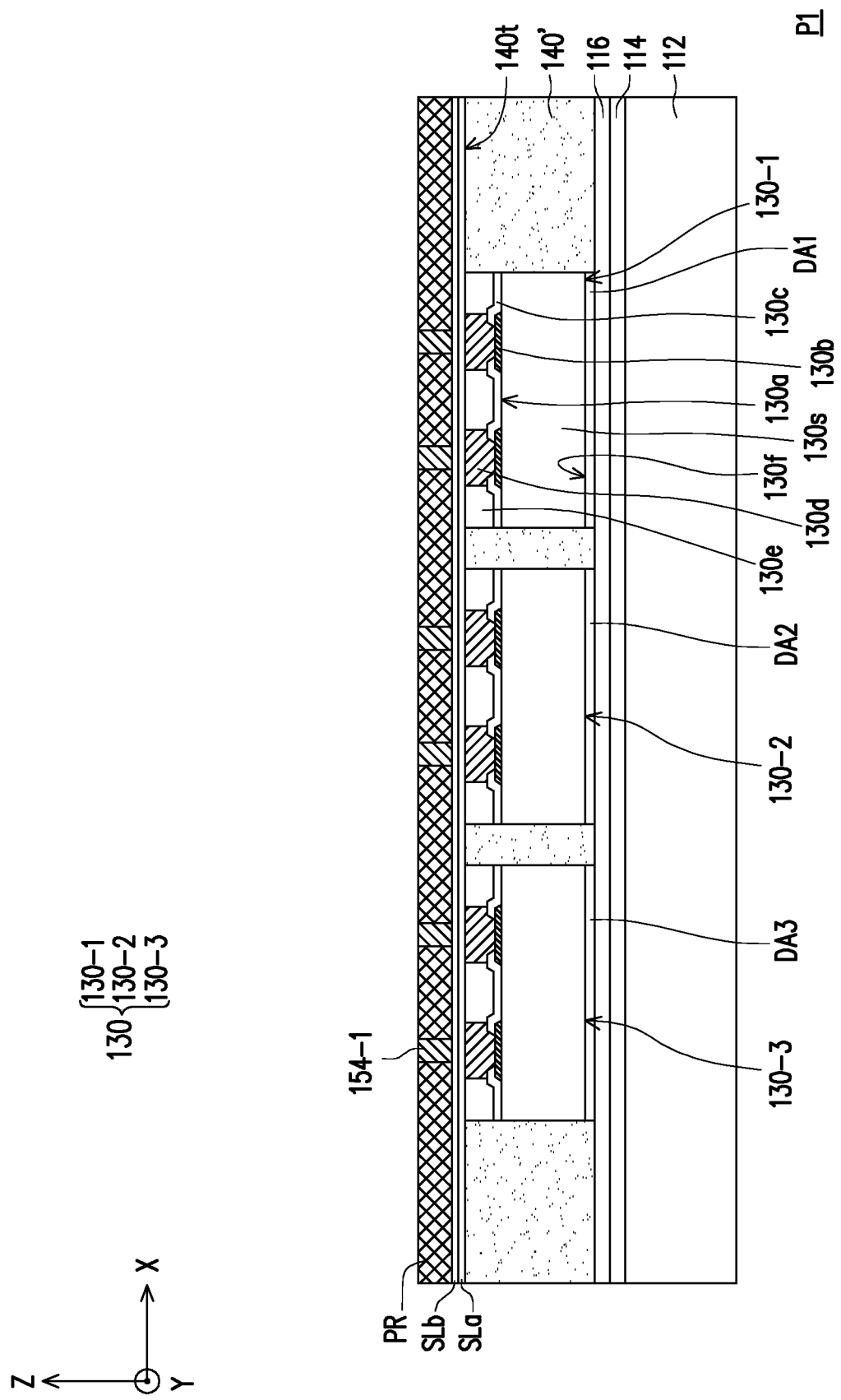

Referring to FIG. 5, in some embodiments, the metallization layer 154-1 is formed over the seed layer SLb and in the openings OP of the resist layer PR. In some embodiments, the material of the metallization layer 154-1 may include a metal material such as copper or copper alloys, or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The number of patterns of the metallization layer 154-1 can be selected based on the demand, and adjusted by changing the number of the openings OP. In some embodiments, the metallization layer 154-1 is formed by plating process.

Figure 21:
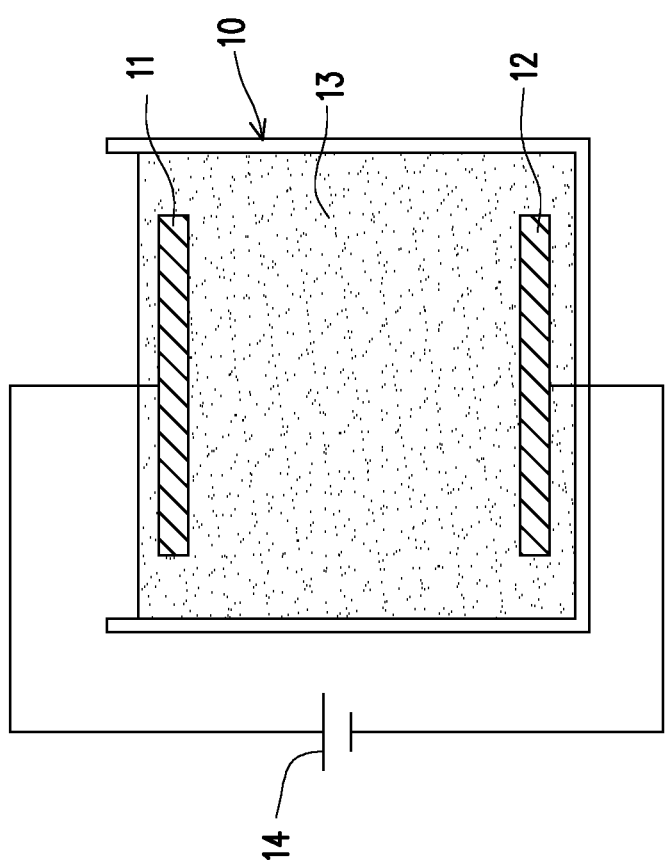
FIG. 21 is a schematic diagram illustrating an electroplating apparatus for performing an electrochemically plating process in accordance with some exemplary embodiments of the disclosure.

For example, the metallization layer 154-1 is formed by forming a metallic material filling the openings OP formed in the resist layer PR to form the metallization layer 154-1 through electroplating (ECP), where metal ions in a plating solution (also known as a plating bath) are deposited on a targeted object (e.g. the seed layer SLb exposed by the openings OP) due to an electric current passed through the targeted object and into the plating solution causes migration of the metal ions in the plating solution to the surface of the targeted object. In some embodiments, the formation of the metallization layer 154-1 may include the following steps: providing an anode (denoted as 11 in FIG. 21) placed in a plating bath tank (denoted as 10 in FIG. 21) filled with the plating solution (denoted as 13 in FIG. 21); placing the structure depicted in FIG. 4 (serving as a cathode and denoted as 12 in FIG. 21) into the plating solution 13; and respectively applying voltages from a power source (denoted as 14 in FIG. 21) to the structure depicted in FIG. 4 (e.g., the cathode 12) and the anode 11 to carry out an electrodeposition at the exposed seed layer SLb of the structure depicted in FIG. 4 to perform the electroplating process.

A material of the anode is, for example, the same as the material of the metallization layer 154-1, e.g. copper. In the electroplating process, the structure depicted in FIG. 4 and the anode are immersed in the plating solution containing ions that permit the flow of electricity. In some embodiments, the voltage applied to the anode is a positive voltage, while the voltage applied to the structure depicted in FIG. 4

(serving as cathode) is a lower voltage relative to the voltage applied to the anode. After the positive voltage is applied to the anode, copper in the anode is oxidized by losing two electrons, which allows it to dissolve in the plating solution as in a form of metal ions (cation $Cu^{2+}$). After the lower voltage is applied to the structure depicted in FIG. 4 (serving as the cathode), the dissolved metal ions (cation $Cu^{2+}$) in the plating solution are reduced to metallic copper onto the structure depicted in FIG. 4 (e.g. the exposed seed layer SLb) by gaining two electrons. The result is the transfer of copper form the anode to the structure depicted in FIG. 4, which is the formation of the metallization layer 154-1 formed on the exposed seed layer SLb as shown in FIG. 5. The rate at which the anode is dissolved is substantially equal to the rate at which the structure depicted in FIG. 4 (e.g. the exposed seed layer SLb) is plated. In some embodiments, the structure depicted in FIG. 4 (serving as cathode) and the anode may be rotated after (or before, upon) being immersed in the plating solution at a plating rotation speed to prevents bubble entrapment on a plated-to-be surface of the exposed seed layer SLb of the structure depicted in FIG. 4, thereby ensuring uniformity of the plating and averaging possible disturbances and improves electrolyte transport to the structure depicted in FIG. 4.

For example, the plating solution for plating copper includes hydrochloric acid (HCl), copper sulfate ($CuSO_4$), sulfuric acid ($H_2SO_4$), and a first additive. The sulfuric acid disassociates the copper ions from the copper sulfate, allowing the copper sulfate to migrate to the exposed seed layer SLb and form copper plate, while the chloride ions prevent copper oxide generated by the reaction between the copper ions in the plating solution and oxygen ($O_2$) in the environment. In some embodiments, an amount of chloride ions in the plating solution is approximately in a range of 5 ppm to 100 ppm. In some embodiments, a concentration of copper sulfate in the plating solution is approximately ranging from 5 g/L to 300 g/L. In some embodiments, a concentration of sulfuric acid in the plating solution is approximately ranging from 10 g/L to 200 g/L.

In some embodiments, the first additive includes a compound represented by the following formula,

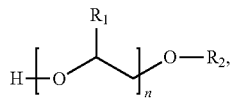

where $R_1$ and $R_2$ independently are selected from a group consisting of a substituted or unsubstituted aromatic group and a substituted or unsubstituted hetero aromatic group, and n is an integer of 5 to 250. In some embodiments, the first additive has a weight average molecular weight (Mw) approximately ranging from 200 to 10,000. For example, a concentration of the first additive in the plating solution is approximately ranging from 0.2 mL/L to 20 mL/L.

In the disclosure, the first additive may be referred to as a suppressor, where in the formation of the metallization layer 154-1 through the plating process (e.g. ECP), the first additive inhibits the grow of copper oriented at a (111) copper lattice plane (e.g. second banded structures 320 in FIG. 7A) but promotes the grow of copper oriented at a (220) copper lattice plane (e.g. first banded structures 310 in FIG. 7A). In some embodiments, through the plating process, each pattern of the metallization layer 154-1 has a plurality of copper crystal grains 300, and the copper crystal grains 300 each have a columnar shape (e.g. a columnar structure) extending along the stacking direction Z as shown in the enlarged cross-sectional view of FIG. 7A. For example, each copper crystal grain 300 is formed in a columnar structure by stacking the first banded structures 310 and the second banded structure 320 along the stacking direction Z. In some embodiments, for the metallization layer 154-1, a ratio of a number of the first banded structures 310 to a number of the second banded structures 320 is approximately less than or substantially equal to 0.4 and is approximately less than 1.0. In other words, in each copper crystal grain 300, the number of the first banded structures 310 is greater than the number of the second banded structures 320. Owing to the first additive, the growth orientation of the copper crystal grains 300 in the metallization layer 154-1 can be fine-tuned by the first additive, where the copper ions are disposed on the exposed seed layer SLb with a (220) crystallization.

For example, the first banded structures 310 and the second banded structures 320 individually has a first size measured along the direction X and a second size measured along the stacking direction Z, where the first size is greater than the second size, as shown in FIG. 7A. In the disclosure, considering the geometry of the copper crystal grains 300, the first size may be referred to as a width while the second size may be referred to as a height. That is, for each copper crystal grain 300, a width W300 of the copper crystal grain 300 is corresponding to the width of a respective one first banded structure 310 or a respective one second banded structure 320 of the copper crystal grain 300, where the width of the respective one first banded structure 310 or the respective one second banded structure 320 has the maximum width as compared with other first and second banded structures 310 and 320 in the copper crystal grain 300. In some embodiments, the width W300 of the copper crystal grains 300 is approximately in a range of 0.1 μm to 1.5 μm.

As illustrated in FIG. 7A and FIG. 7B, in some embodiments, each of copper crystal grains 300 is physically connected to adjacent copper crystal grains 300 immediately adjacent thereto at grain boundaries GB thereof, and thus the copper crystal grains 300 in each pattern of the metallization layer 154-1 are electrically coupled to each other. Owing to the growth orientation of the copper crystal grains 300 in the metallization layer 154-1, the microstructure of the metallization layer 154-1 is improved, thereby reducing the voids therein. Due to the copper crystal grains 300 each having the columnar shape and more than 50% of the banded structures (e.g. a total of the first and second banded structures 310 and 320) being included in each copper crystal grain 300 have copper atoms oriented on the (220) copper lattice plane, the metallization layer 154-1 has high thermal stability and improved mechanical properties (e.g. better toughness, tensile strength, and elongation), which improves the electromagnetic behavior thereof; thereby enhancing the reliability of the package structure P1. In addition, the growth orientation of the copper crystal grains 300 in the metallization layer 154-1 can be further tuned by controlling a ratio of the thickness Tb to thickness Ta to be greater than or substantially equal to 1, and the copper ions are more preferred to be disposed on the exposed seed layer SLb with a (220) crystallization over a (111) crystallization.

In some embodiment, the plating conditions suitable for implementation of the above electroplating process include a plating rotation speed of about 30 rpm (rotation per minute) to about 500 rpm, a plating current density of about 0.5 ASD (ampere per square decimeter) to about 30 ASD, a bath pH value of about 0.5 to about 3.5, a workable bath temperature of about 20° C. to about 50° C., and a workable bath pressure of about 1 atm. In addition, a workable working gas of the above electroplating process may include air or nitrogen gas ($N_2$), the disclosure is not limited thereto.

In some embodiments, the plating solution may further include additional second additives such as a brightener (also known as an accelerator), a leveler, and a suppressor. For example, the brightener may include Bis (3-sulfopropyl) disulfide, 3-mercapto-propylsulfonic acid, 3-mercapto-propylsulfonic acid-(3-sulfopropyl)ester, or the like. In some embodiments, a concentration of the brightener may be approximately in a range of 0 mL/L to 50 mL/L. For example, the leveler may include alkylated polyalkyleneimine, 2-mercaptothiazoline, or the like. In some embodiments, a concentration of the leveler may be approximately in a range of 0 mL/L to 50 mL/L. For example, the suppressor may include polyalkylene glycol, polyoxyalkyene glycol, copolymer of polyoxyalkyene, or the like. In some embodiments, a concentration of the suppressor may be approximately in a range of 0 mL/L to 50 mL/L. The disclosure is not limited thereto.

Figure 6:
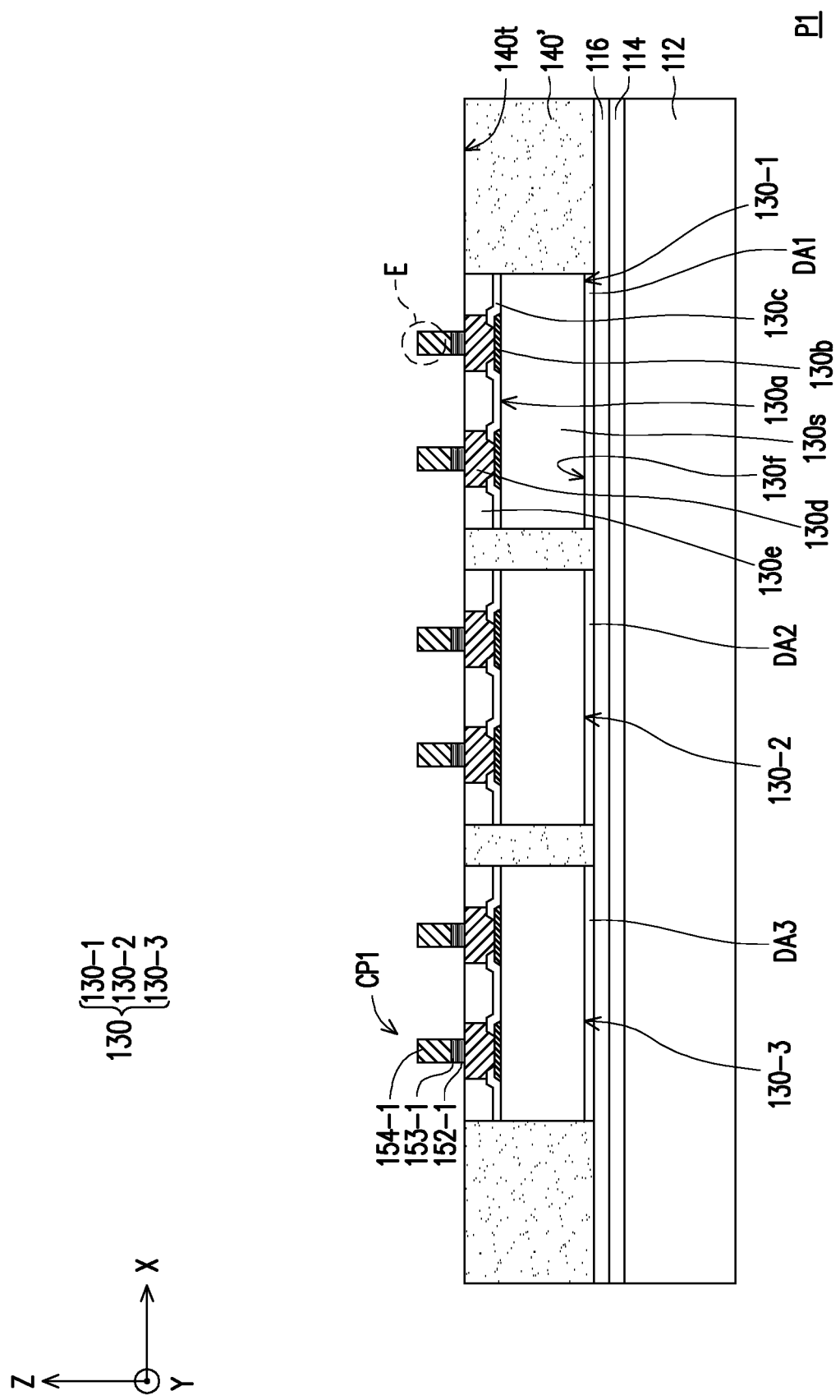
Figure 7B:
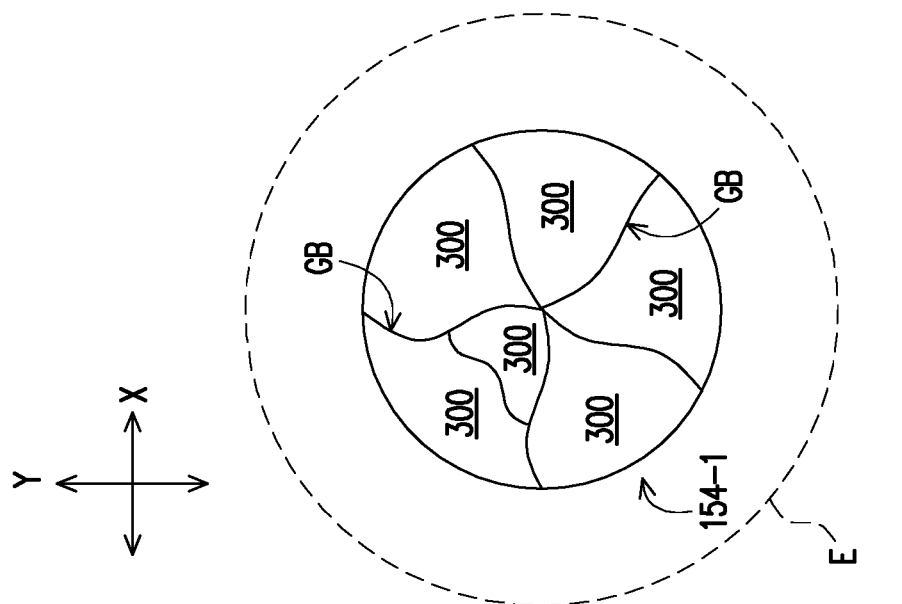
FIG. 7B is an enlarged, schematic top view of a portion of a conductive pattern depicted in FIG. 6.
Figure 7A:
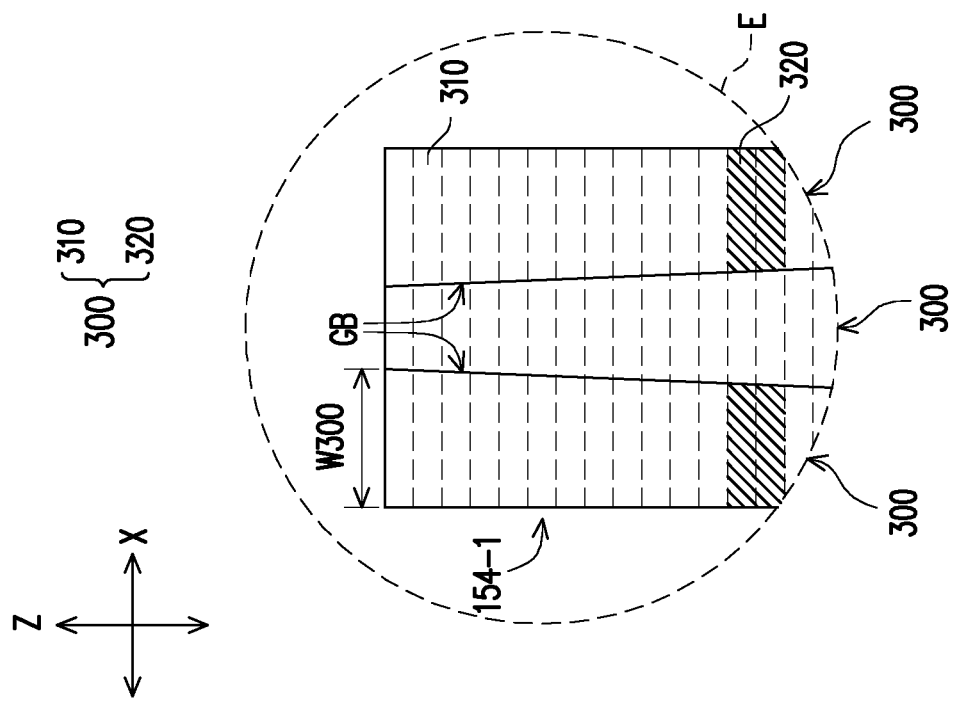
FIG. 7A is an enlarged, schematic cross-sectional view of a portion of a conductive pattern depicted in FIG. 6.

Referring to FIG. 5 and FIG. 6, in some embodiments, after the metallization layer 154-1 is formed, the resist layer PR is removed from the structure depicted in FIG. 5. In some embodiments, the resist layer PR is removed to expose the seed layer SLb not covered by the metallization layer 154-1. In one embodiment, the resist layer PR is removed by acceptable ashing process and/or photoresist stripping process, such as using an oxygen plasma or the like, and the disclosure is not limited thereto.

In some embodiments, the seed layer SLb and the seed layer SLa are sequentially patterned to form the seed layer 153-1 and the seed layer 152-1, respectively. The seed layer 152-1 and the seed layer 153-1 are also referred to as metallic seed layers. In some embodiments, portions of the seed layer SLb is not covered by the metallization layer 154-1 (depicted in FIG. 5) are removed to form the seed layer 153-1, and the portions of the seed layer SLa corresponding to the removed portions of the seed layer SLb are also removed to form the seed layer 152-1. In other words, the seed layer 152-1 and the seed layer 153-1 share the same geometrical shape on the top view, e.g. on the X-Y plane.

In some embodiments, the patterning process may be performed by etching, where the seed layers SLa, SLb are etched to form the seed layers 152-1, 153-1 by using the metallization layer 154-1 as an etching mask. That is, for example, the metallization layer 154-1, the seed layer 152-1 and the seed layer 153-1 share the same geometrical shape on the top view, e.g. on the X-Y plane. For example, the etching process may include a dry etching process or a wet etching process. As shown in FIG. 6, the seed layers 152-1, 153-1 each include one or more conductive segments which are physically and electrically isolated from one another, for example. In certain embodiments, the conductive segments of the seed layer 152-1 are physically and electrically connected to a respective one of the conductive segments of the seed layer 153-1, and the conductive segments of the seed layer 153-1 each are physically and electrically connected to a respective one of the patterns of the metallization layer 154-1, as shown in FIG. 6. In the disclosure, one pattern of the metallization layer 154-1, a respective one conductive segment of the seed layer 153-1, and a respective one conductive segment of the seed layer 152-1 are together referred to as a conductive pattern CP1. In some embodiments, in each of the conductive patterns CP1, a sidewall of the metallization layer 154-1 is aligned with a sidewall of the respective seed layer 152-1 and a sidewall of the respective seed layer 153-1. As shown in FIG. 6, the seed layer 152-1 is sandwiched between the semiconductor dies 130 and the seed layer 153-1, and the seed layer 153-1 is sandwiched between the seed layer 152-1 and the metallization layer 154-1. The metallization layer 154-1 are electrically connected to the semiconductor dies 130 through the seed layer 152-1 and the seed layer 153-1, for example. The seed layer 153-1 is electrically connected to the semiconductor dies 130 through the seed layer 152-1, and the metallization layer 154-1 is electrically connected to the seed layer 152-1 through the seed layer 153-1, for example.

Figure 8:
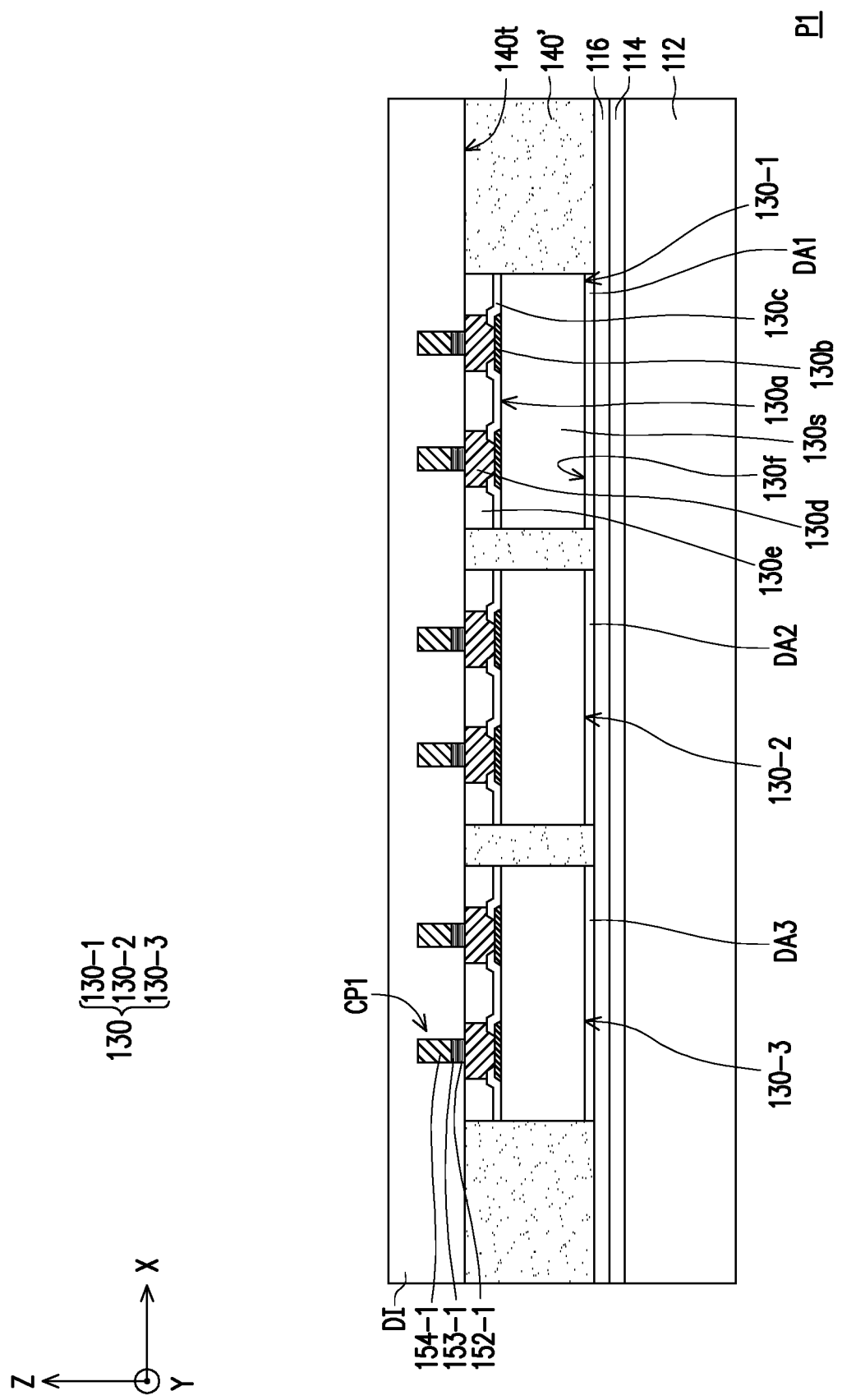

Referring to FIG. 8, in some embodiments, a dielectric material layer DI is formed on the metallization layer 154-1, the semiconductor dies 130, and the insulating encapsulation 140'. The dielectric layer DI is formed by, but not limited to, forming a blanket layer of dielectric material over the structure depicted in FIG. 6 to completely cover the metallization layer 154-1 and the semiconductor dies 130 and the insulating encapsulation 140' exposed by the metallization layer 154-1 and the seed layers 152-1, 153-1. In some embodiments, the material of the dielectric material layer DI may be polyimide, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like. In some embodiments, the dielectric material layer DI may be formed by suitable fabrication techniques such as spin-on coating, chemical vapor deposition (CVD) (such as Plasma Enhanced Chemical Vapor Deposition (PECVD)), or the like. As shown in FIG. 8, the conductive patterns CP1 (including the seed layer 152-1, the seed layer 153-1, and the metallization layer 154-1) are embedded in and not accessibly revealed by the dielectric material layer DI.

Figure 9:
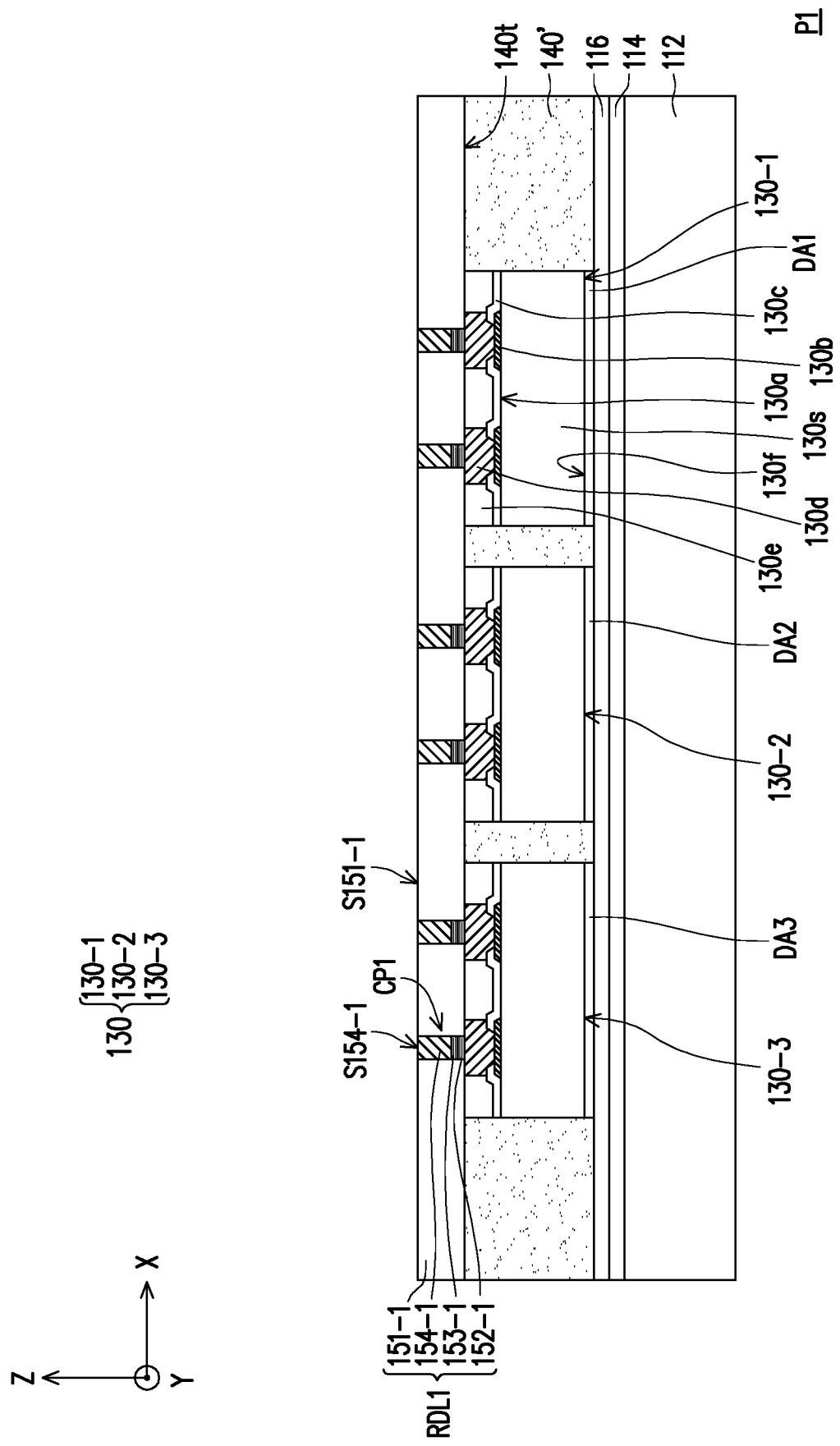

Referring to FIG. 9, in some embodiments, a planarizing step is performed on the dielectric material layer DI to form a dielectric layer 151-1. The dielectric material layer DI may be planarized by mechanical grinding or CMP, for example. In some embodiments, a top surface S151-1 of the dielectric layer 151-1 is substantially leveled with a top surface S154-1 of the metallization layer 154-1. That is, the top surface S151-1 of the dielectric layer 151-1 and the top surface S154-1 of the metallization layer 154-1 are substantially coplanar to each other. As shown in FIG. 9, top surfaces of the conductive patterns CP1 (e.g. the top surface S154-1 of the metallization layer 154-1) are accessibly exposed by and substantially coplanar to the dielectric layer 151-1.

During planarizing the dielectric material layer DI, the metallization layer 154-1 may also be partially planarized. As shown in FIG. 9, for example, sidewalls of the metallization layer 154-1 and the seed layers 152-1, 153-1 are wrapped around by the dielectric layer 151-1 while the top surface S154-1 of the metallization layer 154-1 is exposed by the dielectric layer 151-1. After the planarizing step, a cleaning step may be optionally performed, for example to clean and remove the residue generated from the planarizing step. However, the disclosure is not limited thereto, and the planarizing step may be performed through any other suitable method. In the disclosure, the layers (e.g. the dielectric layer 151-1 and the conductive patterns CP1 (including the seed layer 152-1, the seed layer 153-1, and the metallization layer 154-1)) formed in FIG. 4 to FIG. 9 may be referred to as a first build-up layer RDL1 of the redistribution circuit structure 150.

Figure 10:
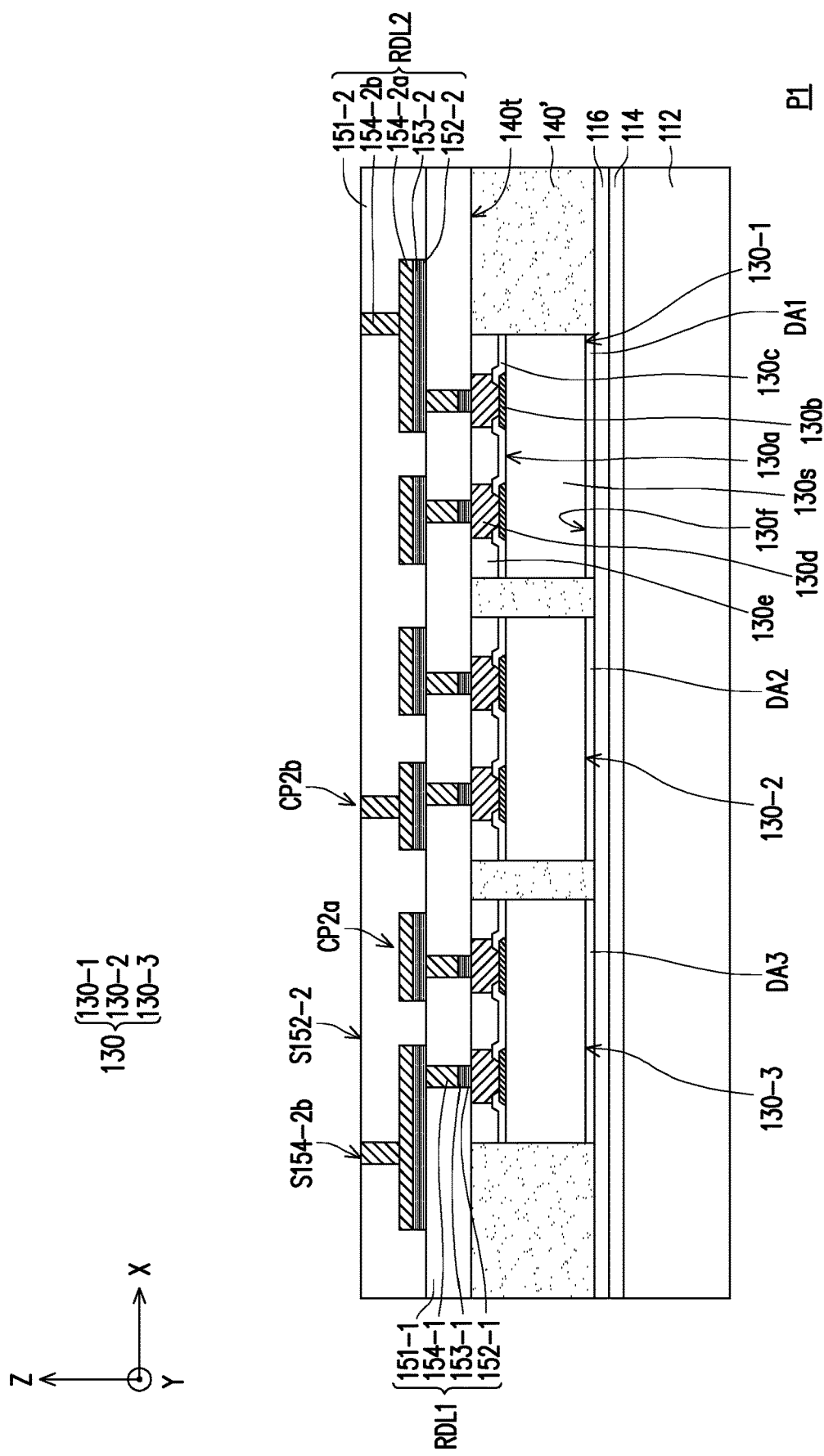

Referring to FIG. 10, in some embodiments, the dielectric layer 151-2, the seed layer 152-2, the seed layer 153-2, the metallization layer 154-2a, and the metallization layer 154-

2b are sequentially formed on the first build-up layer RDL1 of the redistribution circuit structure 150. The formation and material of the dielectric layer 151-2 are the same or similar to the formation and material of the dielectric layer 151-1, the formation and material of the seed layer 152-2 are the same or similar to the formation and material of the seed layer 152-1, the formation and material of the seed layer 153-2 are the same or similar to the formation and material of the seed layer 153-1, and the formations and materials of the metallization layers 154-2a and 154-2b are the same or similar to the formation and material of the metallization layer 154-1; thus are not repeated herein for simplicity. It is noted that, in the disclosure, the plating processes of the metallization layer 154-2b shares the same seed layers (e.g. the seed layers 152-2, 153-2) with the plating process of the metallization layer 154-2a, where resist layers with different sizes of openings are used in the formations of the metallization layer 154-2a and the metallization layer 154-2b. The materials and the formations of the above resist layers with different sizes of openings are the same or similar to the material and the formation of the resist layer PR, and thus are not repeated herein.

In some embodiments, one pattern of the metallization layer 154-2a, a respective one conductive segment of the seed layer 152-2, and a respective one conductive segment of the seed layer 153-2 are together referred to as a conductive pattern CP2a, and one pattern of the metallization layer 154-2a, a respective one pattern of the metallization layer 154-2b, a respective one conductive segment of the seed layer 152-2, and a respective one conductive segment of the seed layer 153-2 are together referred to as a conductive pattern CP2b. In some embodiments, for each of the conductive patterns CP2a and the conductive patterns CP2b, a sidewall of the metallization layer 154-2a is aligned with a sidewall of the respective seed layer 152-2 and a sidewall of the respective seed layer 153-2. In other words, for each of the conductive patterns CP2a and the conductive patterns CP2b, the metallization layer 154-2a, the seed layer 153-2, and the seed layer 152-2 share the same geometric shape on the X-Y plane. As shown in FIG. 10, in some embodiments, for each of the conductive patterns CP2b, an projecting area of the metallization layer 154-2b is less than an projecting area of the metallization layer 154-2a, where the metallization layer 154-2b is completely overlapped with the metallization layer 154-2a along the stacking direction Z on the X-Y plane.

As shown in FIG. 10, in some embodiments, the seed layer 152-2 is directly located on the top surface S154-1 of the metallization layer 154-1 and sandwiched between the seed layer 153-2 and the metallization layer 154-1, the seed layer 153-2 is directly located on the seed layer 152-2 and sandwiched between the seed layer 152-2 and the metallization layer 154-2a, and the metallization layer 154-2a is directly located on the seed layer 153-2 and sandwiched between the seed layer 153-2 and the metallization layer 154-2b or sandwiched between the seed layer 153-2 and the dielectric layer 151-2. In some embodiments, if any, the metallization layer 154-2b is directly located on the metallization layer 154-2a. The seed layer 153-2 is electrically connected to the metallization layer 154-1 through the seed layer 152-2, and the metallization layer 154-2a is electrically connected to the seed layer 152-2 through the seed layer 153-2, for example. The metallization layer 154-2b is electrically connected to the metallization layer 154-2a through physical connection, for example.

As shown in FIG. 10, for example, the metallization layer 154-2a is embedded in the dielectric layer 151-2 while the metallization layer 154-2b is exposed by the dielectric layer 151-2. In some embodiments, top surface S154-2b of the metallization layer 154-2b is exposed by the dielectric layer 151-2. For example, the top surface S154-2b of the metallization layer 154-2b is substantially leveled with a top surface S151-2 of the dielectric layer 151-2. In some embodiments, as shown in FIG. 10, the top surface S154-2b of the metallization layer 154-2b and the top surface S151-2 of the dielectric layer 151-2 are substantially coplanar to each other. That is, top surfaces of the conductive patterns CP2a (e.g. top surface of the metallization layer 154-2a) are not accessibly exposed by the dielectric layer 151-2, while top surfaces of the conductive patterns CP2b (e.g. the top surface S154-2b of the metallization layer 154-2b) are accessibly exposed by and substantially coplanar to the dielectric layer 151-2. In the disclosure, the layers (e.g. the dielectric layer 151-2, the conductive patterns CP2a (each including the metallization layer 154-2a, the seed layer 153-2 and the seed layer 152-2) and the conductive patterns CP2b (each including the metallization layer 154-2b, the metallization layer 154-2a, the seed layer 153-2 and the seed layer 152-2)) may be referred to as a second build-up layer RDL2 of the redistribution circuit structure 150.

Figure 11:
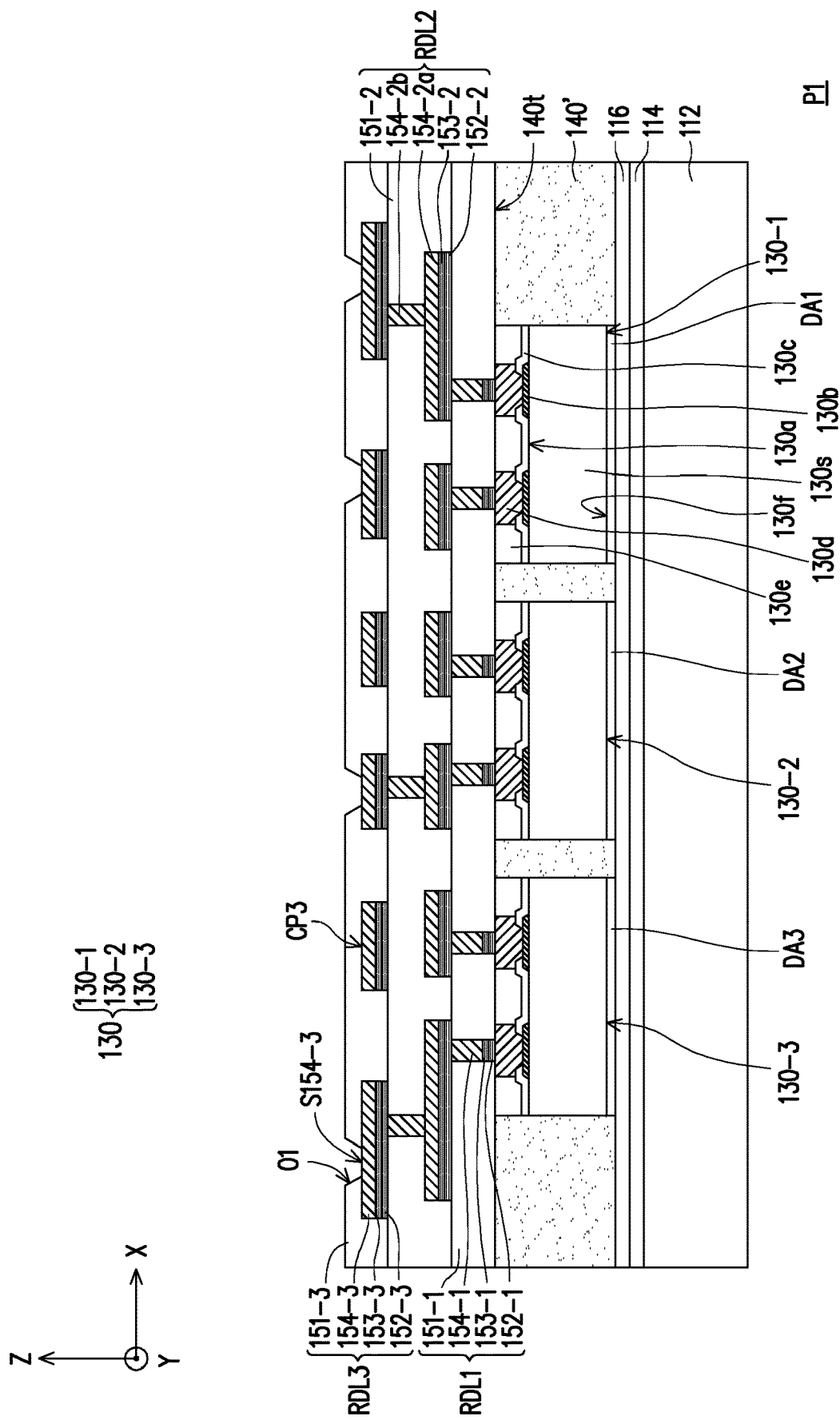

Referring to FIG. 11, in some embodiments, the dielectric layer 151-3, the seed layer 152-3, the seed layer 153-3, and the metallization layer 154-3 are sequentially formed on the second build-up layer RDL2 of the redistribution circuit structure 150. The formation and material of the dielectric layer 151-3 are the same or similar to the formation and material of the dielectric layer 151-1, the formation and material of the seed layer 152-3 are the same or similar to the formation and material of the seed layer 152-1, the formation and material of the seed layer 153-3 are the same or similar to the formation and material of the seed layer 153-1, and the formation and material of the metallization layer 154-3 are the same or similar to the formation and material of the metallization layer 154-1; thus are not repeated herein.

In some embodiments, one pattern of the metallization layer 154-3, a respective one conductive segment of the seed layer 152-3, and a respective one conductive segment of the seed layer 153-3 are together referred to as a conductive pattern CP3. In some embodiments, as shown in FIG. 11, for each of the conductive patterns CP3, a sidewall of the metallization layer 154-3 is aligned with a sidewall of the respective seed layer 152-3 and a sidewall of the respective seed layer 153-3. In other words, for each of the conductive patterns CP3, the metallization layer 154-3, the seed layer 153-3, and the seed layer 152-3 share the same geometric shape on the X-Y plane.

As illustrated in FIG. 11, in some embodiments, the seed layer 152-3 is directly located on the metallization layer 154-2b and sandwiched between the seed layer 153-3 and the metallization layer 154-2b, the seed layer 153-3 is directly located on the seed layer 152-3 and sandwiched between the seed layer 152-3 and the metallization layer 154-3, and the metallization layer 154-3 is directly located on the seed layer 153-3 and sandwiched between the seed layer 153-3 and the dielectric layer 151-3. In some embodiments, the seed layer 153-3 is electrically connected to the metallization layer 154-2b through the seed layer 152-3, and the metallization layer 154-3 is electrically connected to the seed layer 152-3 through the seed layer 153-3, as shown in FIG. 11.

In some embodiments, the dielectric layer 151-3 includes a plurality of openings O1 exposing at least a portion of the metallization layer 154-3. That is, top surfaces S154-3 of a portion of the metallization layer 154-3 are at least partially exposed by the openings O1 formed in the dielectric layer 151-3, for example. The number of the openings O1 is not limited to what is depicted in FIG. 11, and may be selected and designated based on the demand; the disclosure is not limited thereto. As shown in FIG. 11, top surfaces of the conductive patterns CP3 (e.g. the top surfaces S154-3 of the portion of the metallization layer 154-3) are accessibly exposed by the dielectric layer 151-3, in some embodiments. In the disclosure, the layers (e.g. the dielectric layer 151-3 and the conductive patterns CP3 (each including the metallization layer 154-3, the seed layer 153-3 and the seed layer 152-3)) may be referred to as a third build-up layer RDL3 of the redistribution circuit structure 150.

Figure 12:
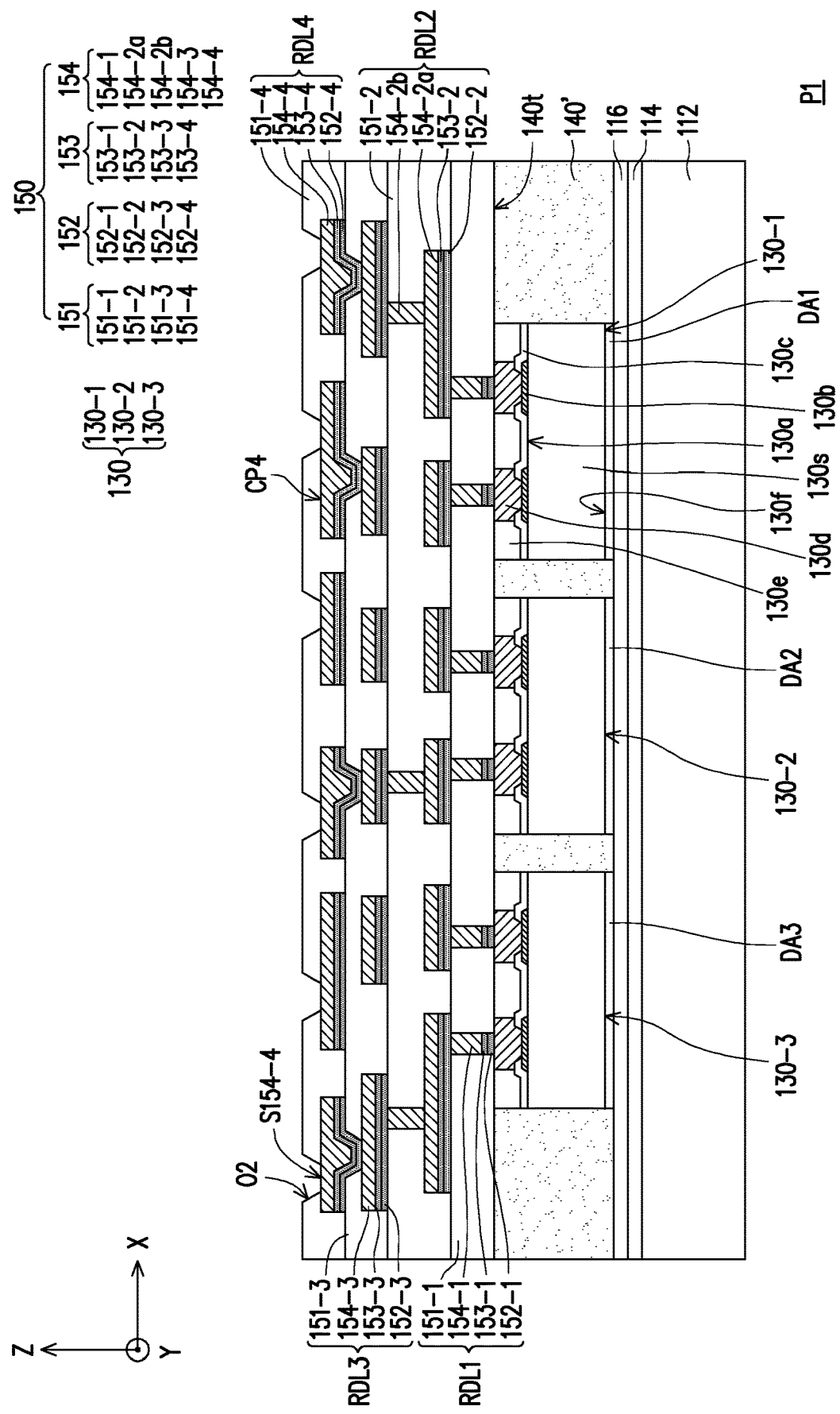

Referring to FIG. 12, in some embodiments, the dielectric layer 151-4, the seed layer 152-4, the seed layer 153-4, and the metallization layer 154-4 are sequentially formed on the third build-up layer RDL3 of the redistribution circuit structure 150. The formation and material of the dielectric layer 151-4 are the same or similar to the formation and material of the dielectric layer 151-1, the formation and material of the seed layer 152-4 are the same or similar to the formation and material of the seed layer 152-1, the formation and material of the seed layer 153-4 are the same or similar to the formation and material of the seed layer 153-1, and the formation and material of the metallization layer 154-4 are the same or similar to the formation and material of the metallization layer 154-1; thus are not repeated herein.

In some embodiments, one pattern of the metallization layer 154-4, a respective one conductive segment of the seed layer 152-4, and a respective one conductive segment of the seed layer 153-4 are together referred to as a conductive pattern CP4. In some embodiments, as shown in FIG. 12, for each of the conductive patterns CP4, a sidewall of the metallization layer 154-4 is aligned with a sidewall of the respective seed layer 152-4 and a sidewall of the respective seed layer 153-4. In other words, for each of the conductive patterns CP4, the metallization layer 154-4, the seed layer 153-4, and the seed layer 152-4 share the same geometric shape on the X-Y plane.

As illustrated in FIG. 12, in some embodiments, the seed layer 152-4 is directly located on the metallization layer 154-3 and sandwiched between the seed layer 153-4 and the metallization layer 154-3, the seed layer 153-4 is directly located on the seed layer 152-4 and sandwiched between the seed layer 152-4 and the metallization layer 154-4, and the metallization layer 154-4 is directly located on the seed layer 153-4 and sandwiched between the seed layer 153-4 and the dielectric layer 151-4. In some embodiments, the seed layer 153-4 is electrically connected to the metallization layer 154-3 through the seed layer 152-4, and the metallization layer 154-4 is electrically connected to the seed layer 152-4 through the seed layer 153-4, as shown in FIG. 12.

In some embodiments, the dielectric layer 151-4 includes a plurality of openings O2 exposing portions of the metallization layer 154-4 for electrically connecting to later-formed connectors or semiconductor device. That is, at least portions of a top surface S154-4 of the metallization layer 154-4 are exposed by the openings O2 formed in the dielectric layer 151-4, for example. The number of the openings O2 is not limited to what is depicted in FIG. 12, and may be selected and designated based on the demand; the disclosure is not limited thereto. As shown in FIG. 12, top surfaces of the conductive patterns CP4 (e.g. the top surfaces S154-4 of at least the portion of the metallization layer 154-4) are accessibly exposed by the dielectric layer 151-4, in some embodiments. In the disclosure, the layers (e.g. the dielectric layer 151-4 and the conductive patterns CP4 (each including the metallization layer 154-4, the seed layer 153-4 and the seed layer 152-4)) may be referred to as a fourth build-up layer RDL4 of the redistribution circuit structure 150. Upon this, the redistribution circuit structure 150 of the package structure P1 is manufactured. In some embodiments, the conductive patterns CP1, CP2, CP3, CP4 independently may serve as conductive vias (referred to as via patterns) or conductive traces (referred to as routing pattern) for providing routing function for the package structure P1.

Continued on in FIG. 12, the semiconductor dies 130-1, 130-2, 130-3 are electrically communicated to each other through the redistribution circuit structure 150, for example. For illustration purpose, there are four build-up layers (e.g. one layer of each of the first, second, third, and fourth build-up layers RDL1, RDL2, RDL3, RDL4) included in the redistribution circuit structure 150 of FIG. 12; however, the disclosure is not limited thereto. The numbers of the first, second, third, and fourth build-up layers RDL1, RDL2, RDL3, RDL4 included in the redistribution circuit structure 150 is not limited in the disclosure. For example, the number of the first and second build-up layers RDL1, RDL2 included in the redistribution circuit structure 150 may be one or more than one, while the number of the third and fourth build-up layers RDL3, RDL4 included in the redistribution circuit structure 150 may be zero, one or more than one.

Figure 13:
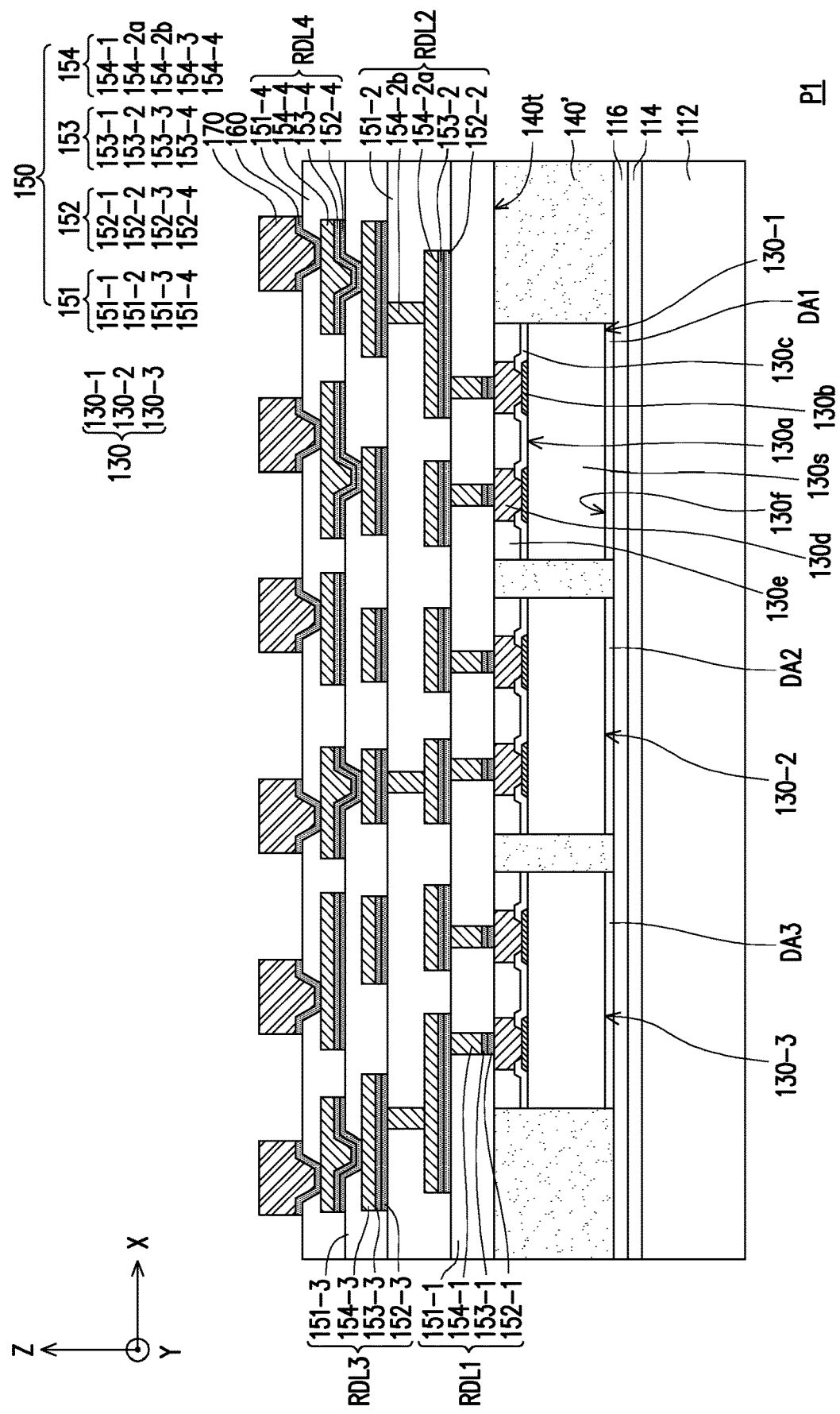

Referring to FIG. 13, in some embodiments, a plurality of seed-layer patterns 160 and a plurality of conductive elements 170 are formed over the redistribution circuit structure 150. In some embodiments, the seed-layer patterns 160 each are located between a respective one of the conductive elements 170 and the dielectric layer 151-4/the conductive pattern CP4 of the redistribution circuit structure 150. Due to the seed-layer patterns 160, the adhesive strength between the conductive elements 170 and the redistribution circuit structure 150 is enhanced. In some embodiments, the seed-layer patterns 160 are directly located on the portions of the metallization layer 154-4 exposed by the openings O2 formed in the dielectric layer 151-4. As shown in FIG. 13, in some embodiments, the seed-layer patterns 160 are electrically connected to the redistribution circuit structure 150, and the conductive elements 170 are electrically connected to the redistribution circuit structure 150 through the seed-layer patterns 160.

In some embodiments, the conductive elements 170 are electrically connected to the semiconductor dies 130 through the redistribution circuit structure 150 and the seed-layer patterns 160. For example, some of the conductive elements 170 are electrically connected to the semiconductor die 130-1 through the redistribution circuit structure 150 and respective ones of the seed-layer patterns 160. For example, some of the conductive elements 170 are electrically connected to the semiconductor die 130-2 through the redistribution circuit structure 150 and respective ones of the seed-layer patterns 160. For example, some of the conductive elements 170 are electrically connected to the semiconductor die 130-3 through the redistribution circuit structure 150 and respective ones of the seed-layer patterns 160.

In some embodiments, the seed-layer patterns 160 are formed by, but not limited to, forming a blanket layer of a seed layer material (not shown) on the dielectric layer 151-4, forming the conductive elements 170 on the seed layer material blanket layer, patterning the seed layer material blanket layer by using the conductive elements 170 as a mask. For example, the seed layer material blanket layer is conformally formed on the dielectric layer 151-4 and extends into the openings O2 formed in the dielectric layer 151-4 to physically and electrically contact the metallization layer 154-4 exposed by the openings O2, where sidewalls of the openings O2 are completely covered by the seed layer material blanket layer. In some embodiments, the seed layer material blanket layer is referred to as a metal layer, which may be a single layer or a composite layer comprising a plurality of sub-layers formed of different materials. In some embodiments, the seed layer material blanket layer may include titanium, copper, molybdenum, tungsten, titanium nitride, titanium tungsten, combinations thereof, or the like. For example, the seed layer material blanket layer may include a titanium layer and a copper layer over the titanium layer. The seed layer material blanket layer may be formed using, for example, sputtering, PVD, or the like.

In some embodiments, the formation of the conductive elements 170 may be formed by forming a patterned photoresist layer (not shown) having openings exposing portions of the seed layer material blanket layer by photolithography, and immersing the whole structure including the patterned photoresist layer formed thereon into a plating solution so as to plate the conductive elements 170 on the seed layer material blanket layer corresponding in position to the portions of the seed layer material blanket layer exposed by the openings formed in the patterned photoresist layer. In one embodiment, the patterned photoresist layer may be formed by coating and photolithography processes or the like. In some embodiments, the formation and material of patterned photoresist layer, for example, may be the same or similar to the formation and material of the resist layer PR described in FIG. 4. Due to the patterned photoresist layer, the size and number of the conductive elements 170 can be easily modified by adjusting the size and number of the openings in the patterned photoresist layer. As shown in FIG. 13, the conductive elements 170, for example, includes copper pillars, copper vias, or the like; the disclosure is not limited thereto.

After the conductive elements 170 are formed, the patterned photoresist layer is removed to expose the seed layer material blanket layer not covered by the conductive elements 170. In one embodiment, the patterned photoresist layer is removed by acceptable ashing process and/or photoresist stripping process, such as using an oxygen plasma or the like, and the disclosure is not limited thereto.

In some embodiments, the seed layer material blanket layer is patterned by using the conductive elements 170 as an etching mask to form the seed-layer patterns 160. For example, the etching process may be a dry etching process, a wet etching process, or a combination thereof; the disclosure is not limited thereto. In other words, the seed layer material blanket layer not covered by the conductive elements 170 are removed to form the seed-layer patterns 160. In some embodiments, as shown in FIG. 13, sidewalls of the seed-layer patterns 160 are aligned with sidewalls of a respective one of the conductive elements 170.

Figure 14:
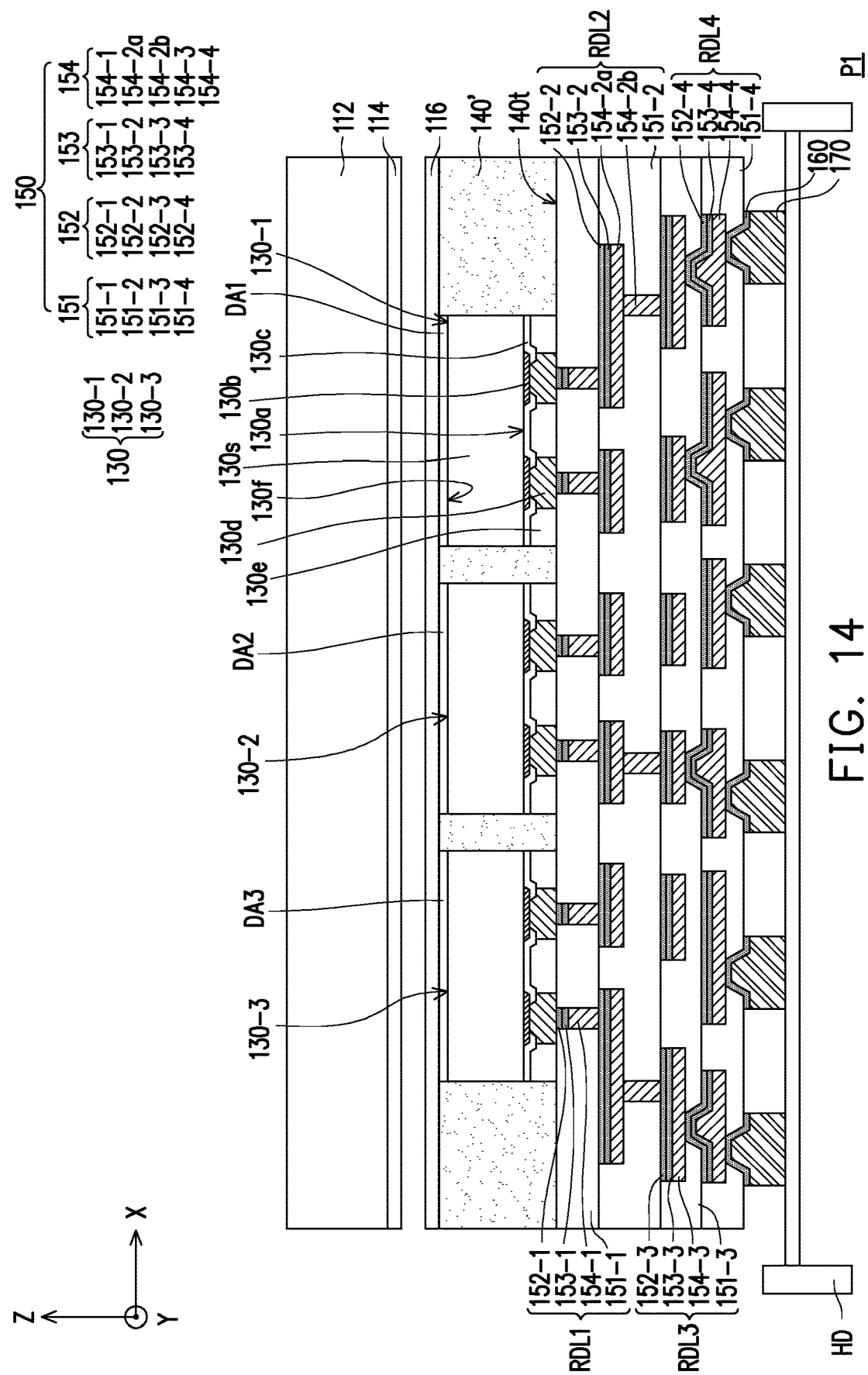

Referring to FIG. 14, in some embodiments, the whole structure depicted in FIG. 13 along with the carrier 112 is flipped (turned upside down), where the conductive elements 170 are placed to a holding device HD, and the carrier 112 is then debonded from the buffer layer 116. In some embodiments, the holding device HD may be an adhesive tape, a carrier film or a suction pad. The disclosure is not limited thereto.

In some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed. In certain embodiments, the buffer layer 116 is exposed, as show in FIG. 14. In one embodiment, the debonding process is a laser debonding process. During the debonding step, the holding device HD is used to secure the package structure P1 before debonding the carrier 112 and the debond layer 114.

Figure 15:
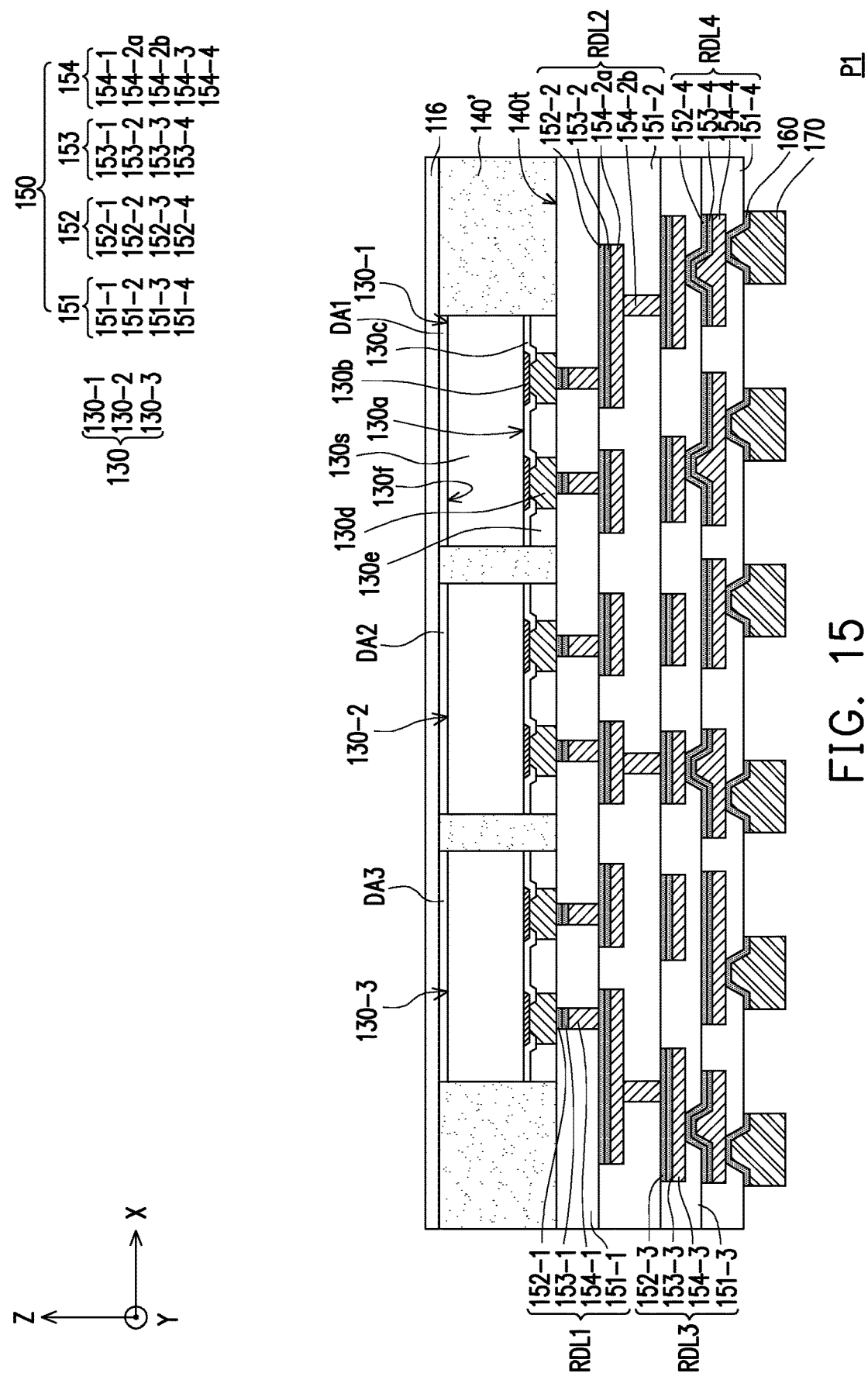

Referring to FIG. 15, in some embodiments, the conductive elements 170 are released from the holding device HD to form the package structure P1. In some embodiments, prior to releasing the conductive elements 170 from the holding device HD, a dicing (singulation) process is performed to cut a plurality of the package structure P1 interconnected therebetween into individual and separated package structure P1. In one embodiment, the dicing (singulation) process is a wafer dicing process including mechanical blade sawing or laser cutting. The disclosure is not limited thereto. Up to here, the manufacture of the package structure P1 is completed.

Figure 16:
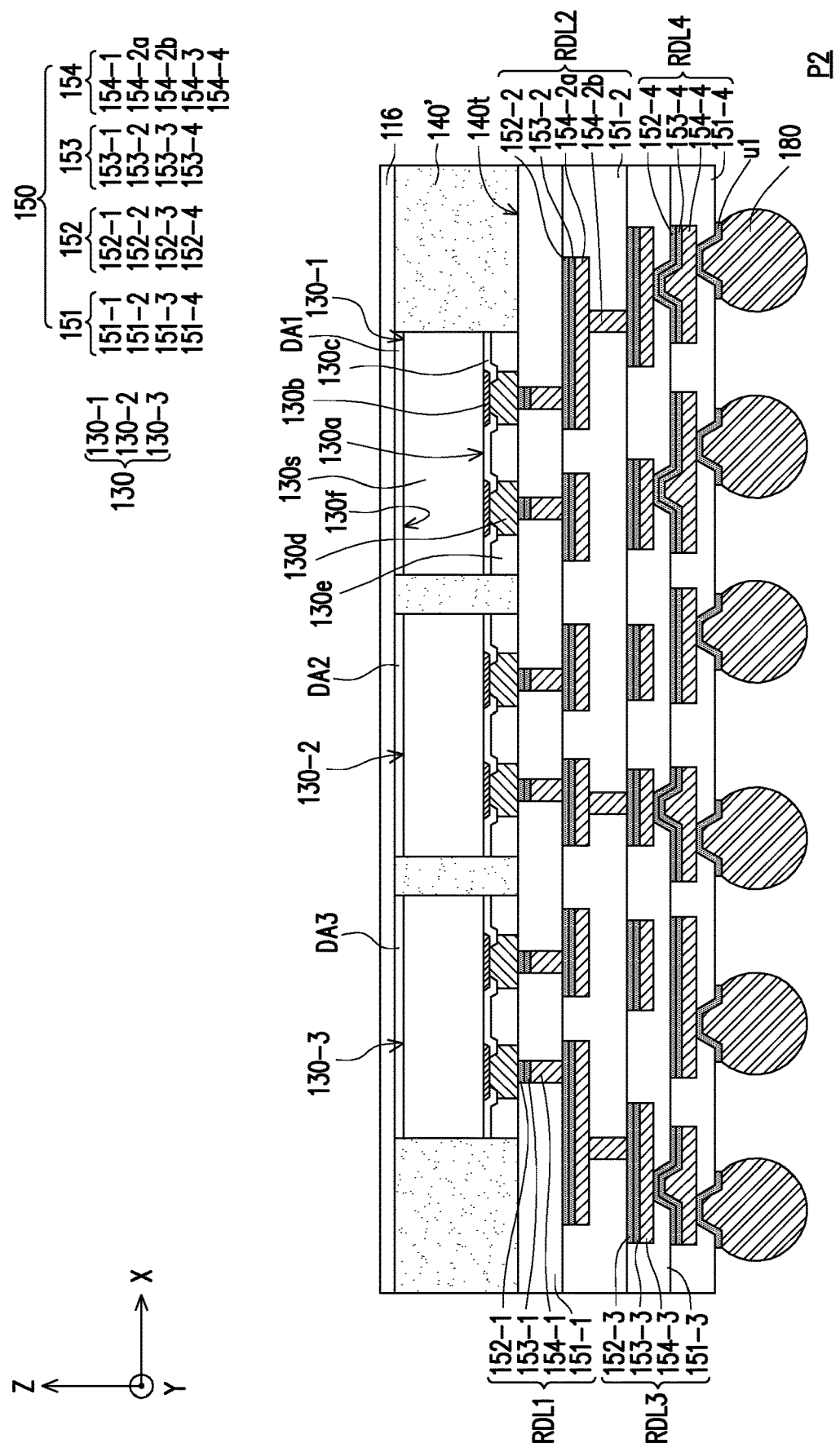
FIG. 16 is a schematic cross-sectional view of a package structure in accordance with some exemplary embodiments of the disclosure.

However, the disclosure is not limited thereto. In alternative embodiments, the conductive elements 170 may be replaced with conductive elements 180 including solder balls or ball grid array (BGA) balls, see a package structure P2 depicted in FIG. 16. With the embodiments of which the conductive elements 180 being solder balls or BGA balls as shown in FIG. 16, the seed layer patterns 160 are replaced with under-ball metallurgy (UBM) patterns u1 to avoid the solder material diffusing from the conductive elements 180 to the redistribution circuit structure 150, thereby ensuring the performance of the package structure P2. In some embodiments, the materials of the UBM patterns u1 may include copper, nickel, titanium, tungsten, or alloys thereof or the like, and may be formed in a manner of a multi-layer (e.g. with different materials in any two adjacent layers in the UBM patterns u1) by an electroplating process, for example. The number of the UBM patterns u1 is not limited in this disclosure.

Figure 17:
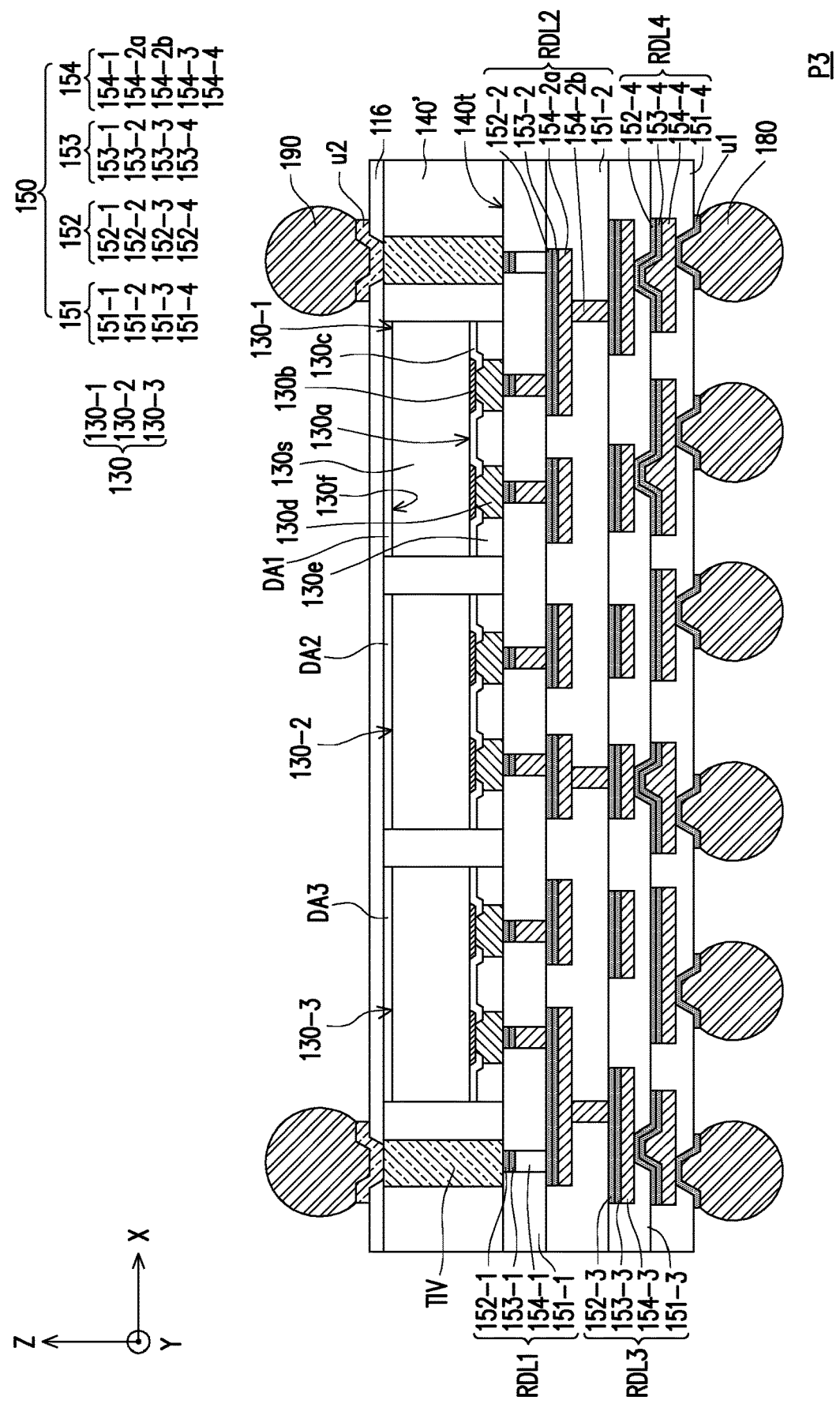
FIG. 17 is a schematic cross-sectional view of a package structure in accordance with some exemplary embodiments of the disclosure.

In other alternative embodiments, a plurality of through interlayer vias TIV may be further included, see a package structure P3 depicted in FIG. 17. In some embodiments, the through interlayer vias TIV may be through integrated fan-out (InFO) vias. With the embodiment of which the through interlayer vias TIV are included as shown in FIG. 17, where the through interlayer vias TIV are arranged aside of the semiconductor dies 130 along the direction X (and the direction Y) and are embedded in the insulating encapsulation 140'. For simplification, only two through interlayer vias TIV are presented in FIG. 17 for illustrative purposes, however it should be noted that the number of the through interlayer vias TIV may be less than two or more than two; the disclosure is not limited thereto. The number of the through interlayer vias TIV to be formed can be selected based on the demand. For example, as shown in FIG. 17, the conductive elements 170 may be replaced with the conductive elements 180 including solder balls or BGA balls, and the seed layer patterns 160 are replaced with the UBM patterns u1; however, the disclosure is not limited thereto.

In some embodiments, two ends of each of the through interlayer vias TIV are exposed by the insulating encapsulation 140'. For example, the through interlayer vias TIV are sandwiched between the buffer layer 116 and the redistribution circuit structure 150, where a first end of each the through interlayer vias TIV is physically connected to the redistribution circuit structure 150, and the through interlayer vias TIV are electrically connected to the semiconductor dies 130 through the redistribution circuit structure 150. For example, the through interlayer vias TIV are formed on the buffer layer 116 by photolithography, plating, photoresist stripping processes or any other suitable method. In one embodiment, the through interlayer vias TIV may be formed by, but not limited to, forming a mask pattern (not shown) covering the buffer layer 116 with openings exposing portions of the buffer layer 116, forming a metallic material filling the openings to form the through interlayer vias TIV by electroplating (e.g. the plating process described in FIG. 5) or deposition, and then removing the mask pattern. For example, the material of the through interlayer vias TIV may include a metal material such as copper or copper alloys, or the like. However, the disclosure is not limited thereto.

Figure 19:
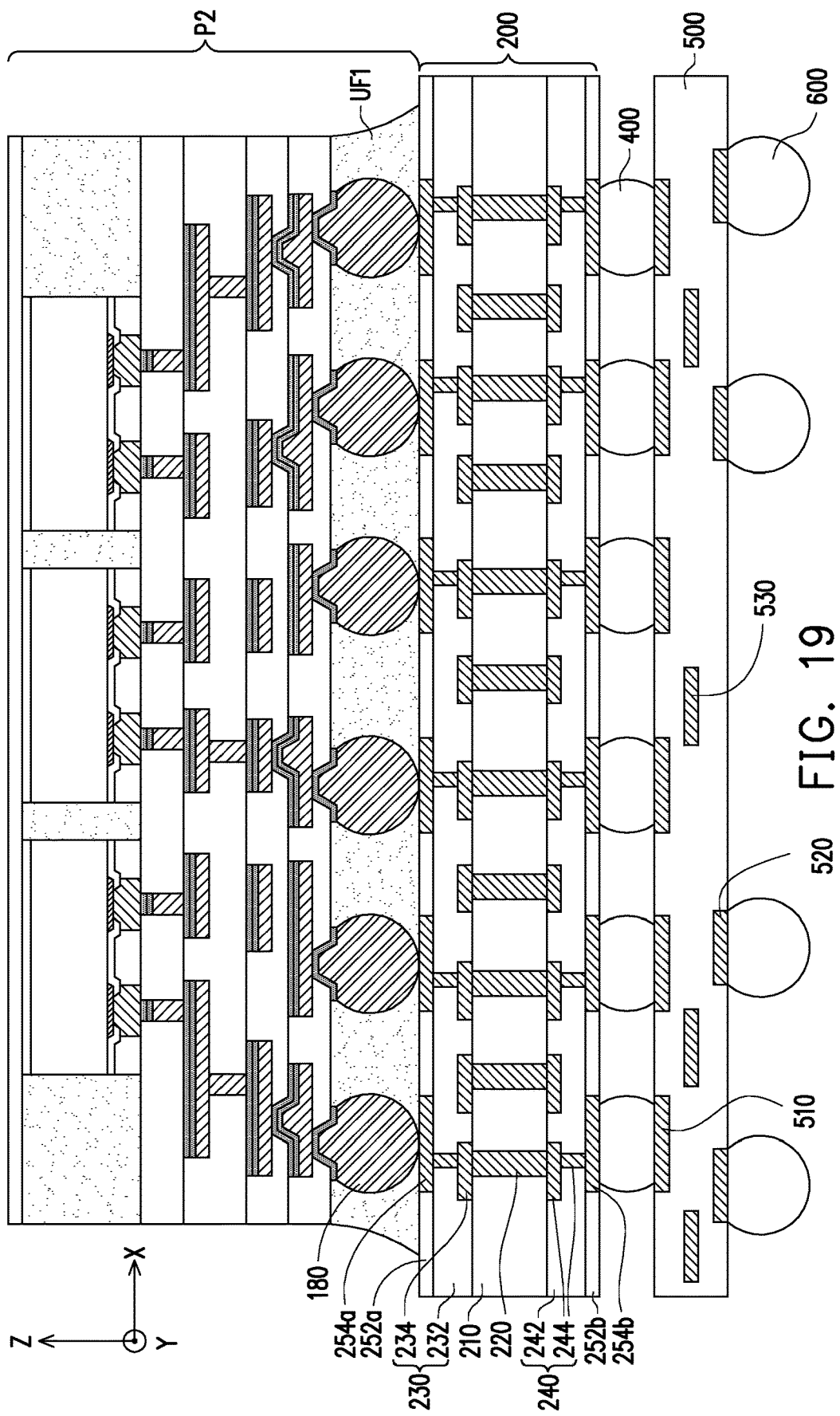
FIG. 19 is a schematic cross-sectional view of a package structure in accordance with some exemplary embodiments of the disclosure.

Continued on FIG. 17, in some embodiments, a plurality of openings (not labeled) are formed in the buffer layer 116 to exposing a second end of each of the through interlayer vias TIV. The number of the openings is not limited in the disclosure, and may be designated based on the demand and design layout. In certain embodiments, a plurality of conductive elements 190 are respectively formed on the second end of each of the through interlayer vias TIV exposed by the openings, and a plurality of UBM patterns u2 are respectively formed to be located between one of the through interlayer vias TIV and a respective one of the conductive elements 190. However, the disclosure is not limited thereto, in alternative embodiments, the UBM patterns u2 may be omitted based on the design layout and demand. The formation and material of the conductive elements 190 are the same or similar to the formation and material of the conductive elements 180, and the formation and material of the UBM patterns u2 are the same or similar to the formation and material of the UBM patterns u1, and thus are not repeated herein. As shown in FIG. 19, the conductive elements 190 are electrically connected to the semiconductor dies 130 through the UBM patterns u2, the through interlayer vias TIV, and the redistribution circuit structure 150. For example, after the conductive elements 190 are disposed on the through interlayer vias TIV, the package structure P3 having dual-side terminals is accomplished.

In further alternative embodiments, in addition to the conductive elements 170 in FIG. 15 and/or the conductive elements 180 in FIG. 16 to FIG. 17, an additional semiconductor element(s) (not shown) may be disposed on the redistribution circuit structure 150 through the seed layer patterns 160 and/or the UBM patterns u1 for electrically connecting to at least one of the semiconductor dies 130. In some embodiments, the additional semiconductor element(s) may include a passive component or an active component. The number of the additional semiconductor element(s) is not limited in the disclosure and may be designated based on the demand and design layout.

In some embodiments, through the conductive elements 170, 180, or 190 and/or other additional connectors, the package structures P1-P3 may be further mounted with a (semiconductor) circuit substrate (e.g. an organic substrate with circuitry structure embedded therein, such as printed circuit board (PCB)), an interposer, an additional package, chips/dies or other electronic devices, to form a stacked package structure, the disclosure is not limited thereto. For illustration, examples are provided as follows, but the disclosure is not limited thereto.

Figure 18:
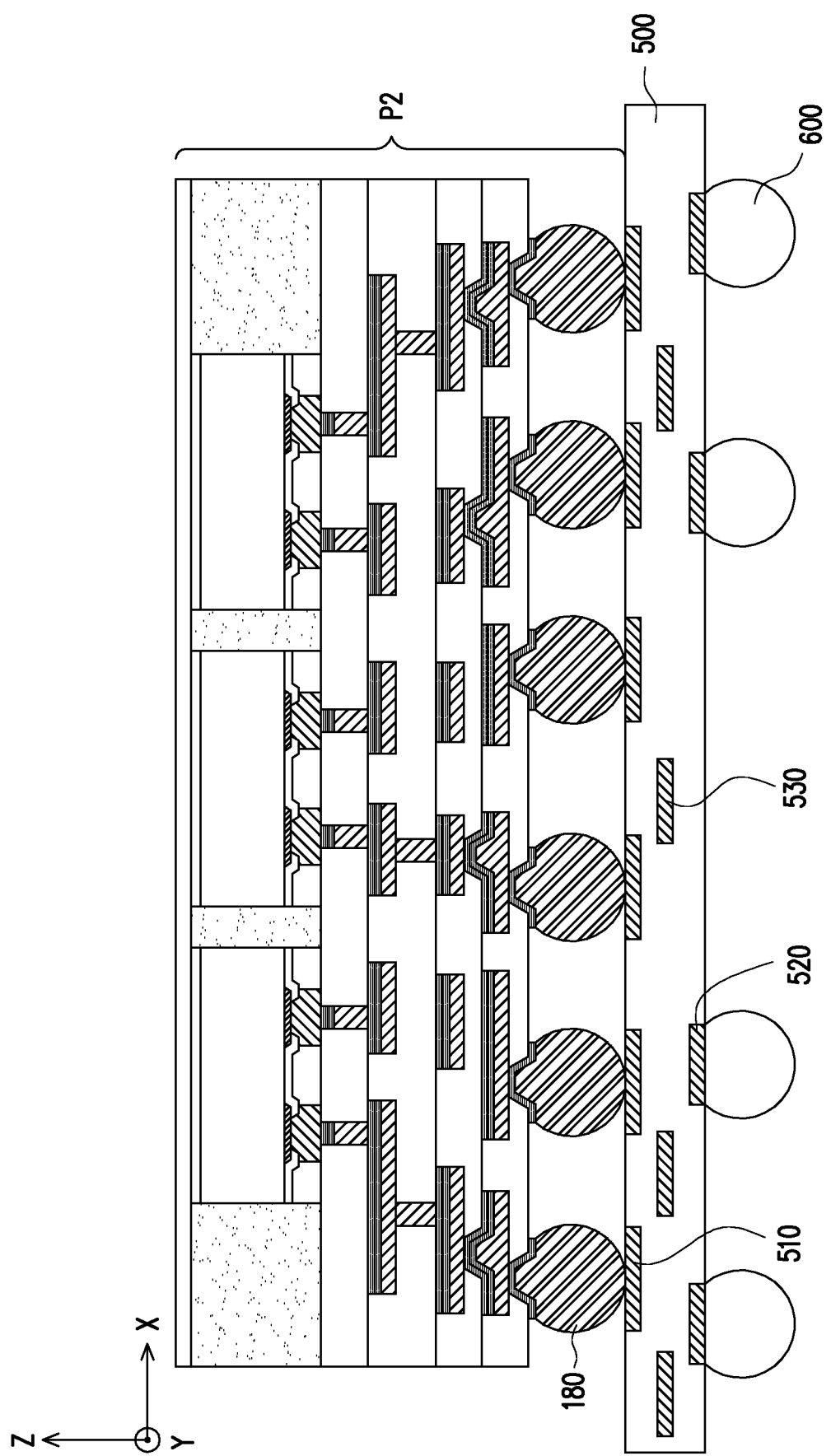
FIG. 18 is a schematic cross-sectional view of a package structure in accordance with some exemplary embodiments of the disclosure.

FIG. 18 is a schematic cross-sectional view of a package structure in accordance with some exemplary embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 18, in some embodiments, a substrate 500 is provided, where the package structure P2 depicted in FIG. 16 is bonded on the substrate 500 to form the package structure having a stacked structure.

In some embodiments, the substrate 500 includes contact pads 510, contact pads 520, metallization layers 530, and vias (not shown). In some embodiments, the contact pads 510 and the contact pads 520 are respectively distributed on two opposite sides of the substrate 500 and are exposed for electrically connecting with later-formed elements/features. In some embodiments, the metallization layers 530 and the vias are embedded in the substrate 500 and together provide routing function for the substrate 500, where the metallization layers 530 and the vias are electrically connected to the contact pads 510 and the contact pads 520. That is, at least some of the contact pads 510 are electrically connected to some of the contact pads 520 through the metallization layers 530 and the vias. In some embodiments, the contact pads 510 and the contact pads 520 may include metal pads or metal alloy pads. In some embodiments, the materials of the metallization layers 530 and the vias may be substantially the same or similar to the material of the metallization layer 154, and thus are not repeated herein for simplicity.

In some embodiments, as shown in FIG. 18, the package structure P2 depicted in FIG. 16 is mounted onto the substrate 500 through physically connecting the conductive element 180 and the contact pads 510 to form the package structure having a stacked structure, where the package structure P2 is physically and electrically connected to the substrate 500. The detail of the package structure P2 is described in FIG. 16, and thus is not repeated herein. In some embodiments, the substrate 500 is referred to as a circuit substrate, such as an organic flexible substrate or a printed circuit board. In such embodiments, the conductive elements 180 are, for example, chip connectors or BGA balls. In some embodiments, an underfill (not shown) may be applied to fill the gap between the package structure P2 and the substrate 500, which enhances the bonding strength between the package structure P2 and the substrate 500; thereby improving the reliability of the package structure depicted in FIG. 18.

In some embodiments, a plurality of conductive terminals 600 are respectively formed on the substrate 500. As shown in FIG. 18, for example, the conductive terminals 600 are connected to the contact pads 520 of the substrate 500. In other words, the conductive terminals 600 are electrically connected to the substrate 500 through the contact pads 520. Through the contact pads 510 and the contact pads 520, some of the conductive terminals 600 are electrically connected to the package structure P2 (e.g. the semiconductor dies 130 included therein). In some embodiments, the conductive terminals 600 are, for example, solder balls or BGA balls. In some embodiments, the package structure P2 is bonded to the substrate 500 through physically connecting the conductive terminals 180 and the contact pads 510 of the substrate 500 by flip chip bonding. However, the disclosure is not limited thereto; in an alternative embodiment, the conductive terminals 600 may be omitted.

FIG. 19 is a schematic cross-sectional view of a package structure in accordance with some exemplary embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 19, in some embodiments, a circuit element 200 is provided, where the package structure P2 depicted in FIG. 16 is bonded on the circuit element 200 mounted to the substrate 500 to form the package structure having a stacked structure. The detail of the package structure P2 is described in FIG. 16, and the detail of the substrate 500 is described in FIG. 18, and thus are not repeated herein. In some embodiments, the circuit element 200 includes a core portion 210, a plurality of vias 220, a redistribution circuit structure 230, a redistribution circuit structure 240, a plurality of bonding pads 254a, a plurality of bonding pads 254b, a solder mask layer 252a, and a solder mask layer 242b.

In some embodiments, the core portion 210 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 220 is through silicon vias penetrating the core portions 210. The circuit element 200 is referred to as an interposer (see FIG. 19), in the disclosure.

In some embodiments, the redistribution circuit structure 230 and the redistribution circuit structure 240 respectively disposed on two opposite sides of the core portion 210, as shown in FIG. 19. In some embodiments, the redistribution circuit structure 230 and/or the redistribution circuit structure 240 are electrically connected to the vias 220 penetrating the core portion 210. As shown in FIG. 19, the core portion 210 embedded with the vias 220 is located between the redistribution circuit structure 230 and the redistribution circuit structure 240, in some embodiments. Through the vias 220, the redistribution circuit structure 230 and the redistribution circuit structure 240 are electrically connected to each other.

In some embodiments, the redistribution circuit structure 230 includes sequentially forming one or more dielectric layers 232 and one or more metallization layers 234 in alternation, where one metallization layer 234 is sandwiched between two dielectric layers 232. As shown in FIG. 19, portions of a top surface of a topmost layer of the metallization layers 234 are respectively exposed by openings formed in a topmost layer of the dielectric layers 232 for connecting with other conductive features, and portions of a bottom surface of a bottommost layer of the metallization layers 234 are respectively exposed by openings formed in a bottommost layer of the dielectric layers 232 for connecting with the vias 220. The numbers of the metallization layers and the dielectric layers included in the redistribution circuit structure 230 are not limited thereto, and may be designated and selected based on the demand.

In some embodiments, the redistribution circuit structure 240 includes sequentially forming one or more dielectric layers 242 and one or more metallization layers 244 in alternation, where one metallization layer 244 is sandwiched between two dielectric layers 242. As shown in FIG. 19, portions of a top surface of a topmost layer of the metallization layers 244 are respectively exposed by openings formed in a topmost layer of the dielectric layers 242 for connecting with the vias 220, and portions of a bottom surface of a bottommost layer of the metallization layers 244 are respectively exposed by openings formed in a bottommost layer of the dielectric layers 242 for connecting with other conductive features. The numbers of the metallization layers and the dielectric layers included in the redistribution circuit structure 240 are not limited thereto, and may be designated and selected based on the demand.

In certain embodiments, the materials of the dielectric layers 232 and the dielectric layers 242 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 232 and the dielectric layers 242 may be formed by suitable fabrication techniques such as spin-on coating, CVD, PECVD, or the like. The disclosure is not limited thereto. In one embodiment, the materials of the dielectric layers 232 and the dielectric layers 242 may be the same. In an alternative embodiment, the materials of the dielectric layers 232 and the dielectric layers 242 may be different.

In certain embodiments, the material of the metallization layers 234 and the metallization layers 244 may be made of conductive materials formed by electroplating or deposition, such as aluminum, titanium, copper, nickel, tungsten, and/or alloys thereof, which may be patterned using a photolithography and etching process. In some embodiments, the metallization layers 234 and the metallization layers 244 may be patterned copper layers or other suitable patterned metal layers. In one embodiment, the materials of the metallization layers 234 and the metallization layers 244 may be the same. In an alternative embodiment, the materials of the metallization layers 234 and the metallization layers 244 may be different.

In some embodiments, the bonding pads 254a are disposed on a surface of the redistribution circuit structure 230 and physically connected to the portions of the top surface of the topmost layer of the metallization layers 234 exposed by the openings formed in the topmost layer of the dielectric layers 232, where the bonding pads 254a are physically separated from each other through the solder mask layer 252a formed on the surface of the redistribution circuit structure 230 with the bonding pads 254a disposed thereon. Through the redistribution circuit structure 230, the bonding pads 254a are electrically connected to the vias 220 embedded in the core portion 210.

In some embodiments, the bonding pads 254b are disposed on a surface of the redistribution circuit structure 240 and physically connected to the portions of the bottom surface of the bottommost layer of the metallization layers 244 exposed by the openings formed in the bottommost layer of the dielectric layers 242, where the bonding pads 254b are physically separated from each other through the solder mask layer 252b formed on the surface of the redistribution circuit structure 240 with the bonding pads 254b disposed thereon. Through the redistribution circuit structure 240, the bonding pads 254b are electrically connected to the vias 220 embedded in the core portion 210.

As shown in FIG. 19, for example, the bonding pads 254a are electrically connected to the redistribution circuit structure 230 and the bonding pads 254b are electrically connected to the redistribution circuit structure 240. In some embodiments, the bonding pads 254a and the bonding pads 254b may include under bump metallurgy (UBM) patterns, however the disclosure is not limited thereto. As shown in FIG. 19, the bonding pads 254a and the bonding pads 254b are electrically connected to each other through the vias 220, the redistribution circuit structure 230, and redistribution circuit structure 240, for example.

In an alternative embodiment, the redistribution circuit structure 230 and the redistribution circuit structure 240, one or both, may be omitted from the circuit element 200, the disclosure is not limited thereto. That is, for example, the circuit element 200 may include a core portion 210, a plurality of vias 220, a plurality of bonding pads 254a, a plurality of bonding pads 254b, a solder mask layer 252a, and a solder mask layer 252b, where the bonding pads 254a and the bonding pads 254b are electrically connected to each other through the vias 220.

In some embodiments, a plurality of conductive terminals 400 are respectively formed on the bonding pads 254b. As shown in FIG. 19, for example, the conductive terminals 400 are physically connected to the bonding pads 254b. In other words, the conductive terminals 400 are electrically connected to the circuit element 200 through the bonding pads 254b. Through the bonding pads 254b, some of the conductive terminals 400 are electrically connected to some of the bonding pads 254a. In some embodiments, the conductive terminals 400 are, for example, chip connectors or BGA balls.

Continued on FIG. 19, in some embodiments, the package structure P2 is physically connected to the circuit element 200 through connecting the conductive elements 180 and the bonding pads 254a of the circuit element 200, and the circuit element 200 is physically connected to the substrate 500 through connecting the conductive terminals 400 and the contact pads 510 of the substrate 500. In other words, the package structure P2 is electrically connected to the circuit element 200 through the conductive elements 180 and the bonding pads 254a, the circuit element 200 is electrically connected to the substrate 500 through the conductive terminals 400 and the contact pads 510, so that the package structure P2 is electrically connected to the substrate 500 through the conductive elements 180, the bonding pads 254a, the conductive terminals 400 and the contact pads 510. In such embodiments, the conductive elements 180 are, for example, micro-bumps while the conductive terminals 400 are chip connectors and the conductive terminals 600 are solder balls or BGA balls. In certain embodiments, the package structure depicted in FIG. 19 may be formed by chip on wafer on substrate (CoWoS) packaging processes.

In some embodiments, an underfill UF1 is optimally formed on the circuit element 200. As shown in FIG. 19, for example, the underfill UF1 at least fills the gaps between the package structure P2 and the circuit element 200, and wraps sidewalls of the conductive elements 180. In some alternative embodiments, a sidewall of the package structure P2 may further covered by the underfill UF1, the disclosure is not limited thereto. The underfill UF1 may be any acceptable material, such as a polymer, epoxy, molding underfill, or the like, for example. In one embodiment, the underfill UF1 may be formed by underfill dispensing or any other suitable method. Owing to the underfill UF1, the bonding strength between the package structure P2 and the circuit element 200 are enhanced, thereby improving the reliability of the package structure depicted in FIG. 19.

Figure 20:
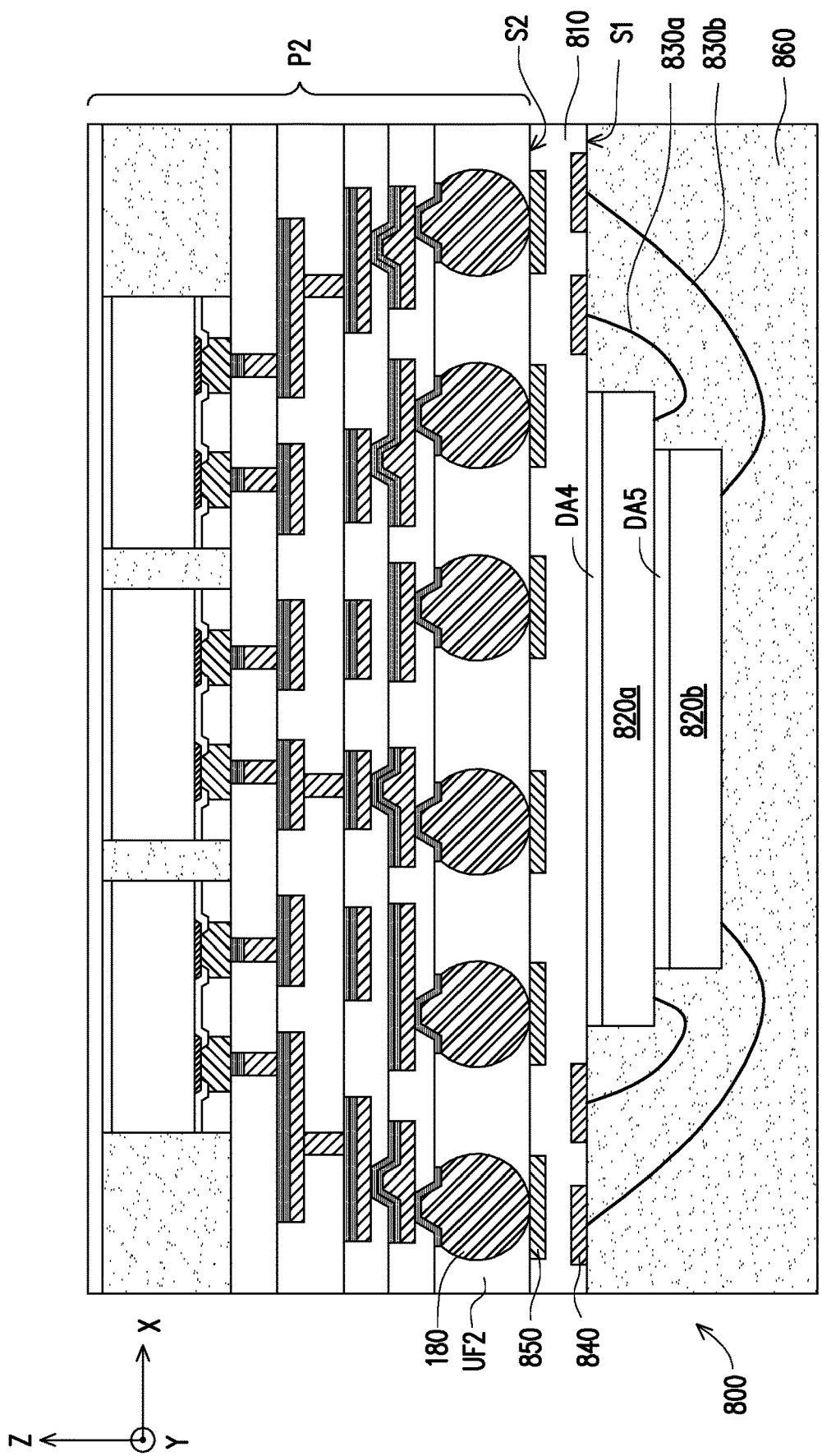
FIG. 20 is a schematic cross-sectional view of a package structure in accordance with some exemplary embodiments of the disclosure.

FIG. 20 is a schematic cross-sectional view of a package structure in accordance with some exemplary embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 20, in some embodiments, a package 800 is provided and bonded to the package structure P2 depicted in FIG. 16 to form the package structure having a stacked structure. The detail of the package structure P2 is described in FIG. 16, and thus is not repeated herein. In some embodiments, the package 800 has a substrate 810, semiconductor dies 820a and 820b, bonding wires 830a and 830b, conductive pads 840, conductive pads 850, an insulating encapsulation 860, and the joining solder balls (not shown).

As shown in FIG. 20, for example, the semiconductor die 820a with a connecting film DA4 disposed thereon and the semiconductor die 820b with a connecting film DA5 are provided and are disposed on the substrate 810. In some embodiments, the connecting film DA4 is located between the semiconductor die 820a and the substrate 810, and the connecting film DA5 is located between the semiconductor die 820a and the semiconductor die 820b. In some embodiments, due to the connecting films DA4 and DA5 respectively provided between the semiconductor die 820a and the substrate 810 and between the semiconductor dies 820a and 820b, the semiconductor dies 820a, 820b are stably adhered to the substrate 810. In some embodiments, the connecting films DA4, DA5 may be, for example, a die attach film, a layer made of adhesives or epoxy resin, or the like.

For example, the semiconductor dies 820a and 820b are mounted on one surface (e.g. a surface S1) of the substrate 810. In some embodiments, the semiconductor dies 820a and 820b may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). The semiconductor dies 820a and 820b are DRAM chips, as shown in FIG. 20, for example. In one embodiment, the semiconductor dies 820a and 820b may be the same. However, the disclosure is not limited thereto; in an alternative embodiment, the semiconductor dies 820a and 820b may be different from each other.

In some embodiments, the bonding wires 830a and 830b are respectively used to provide electrical connections between the semiconductor dies 820a, 820b and some of the conductive pads 840 (such as bonding pads) located on the surface S1 of the substrate 810. Owing to the bonding wires 830a and 830b, the semiconductor dies 820a and 820b are electrically connected to the substrate 810.

In some embodiments, the insulating encapsulation 860 is formed on the surface S1 of the substrate 810 to encapsulate the semiconductor dies 820a, 820b, the bonding wires 830a, 830b, and the conductive pads 840 to protect these components. In some embodiments, the materials of the insulating encapsulation 860 is the same as the insulating encapsulation 140/140', and thus is not repeated herein. In one embodiment, the materials of the insulating encapsulation 860 is different from the insulating encapsulation 140/140', the disclosure is not limited thereto.

In some embodiments, interconnects (not shown) or through insulator vias (not shown) embedded in the substrate 810 may be used to provide electrical connection between the conductive pads 840 and the conductive pads 850 (such as bonding pads) that are located on another surface (e.g. a surface S2 opposite to the surface S1) of the substrate 810. In certain embodiments, some of the conductive pads 850 are electrically connected to the semiconductor dies 820a and 820b through these insulator vias or interconnects (not shown) in addition to some of the conductive pads 840 and the bonding wires 830a, 830b.

In some embodiments, the conductive pads 850 of the package 800 are physically connected to the conductive elements 180 of the package structure P2, and the package 800 is electrically coupled to the package structure P2. In some embodiments, the redistribution circuit structure 150 is electrically connected to the substrate 810 of the package 800 through the conductive elements 180 and the conductive pads 850. In some embodiments, the semiconductor dies 820a, 820b are electrically communicated to the semiconductor dies 130 of the package structure P2.

In addition, as shown in FIG. 20, an underfill UF2 fills the gaps between the conductive elements 180 and the substrate 810, for example. In one embodiment, the formation and material of the underfill UF2 may be the same or similar to the formation of the material of the underfill UF1 described in FIG. 19, the disclosure is not limited thereto. Owing to the underfill UF2, a bonding strength between the package structure P2 and the package 800 are enhanced, thereby improving the reliability of the package structure depicted in FIG. 20.

Additionally, the package structure P2 may be replaced with the package structure P1 depicted in FIG. 15 or the package structure P3 depicted in FIG. 17, the disclose is not limited thereto.

In accordance with some embodiments, a package structure includes a semiconductor die and a redistribution circuit structure. The redistribution circuit structure is disposed on and electrically connected to the semiconductor die and includes a metallization layer and a dielectric layer disposed on the metallization layer. The metallization layer has conductive patterns, where each of the conductive patterns includes crystal grains, the crystal grains each are in a column shape and include a plurality of first banded structures having copper atoms oriented on a (220) lattice plane.

In accordance with some embodiments, a circuitry structure includes a copper conductive layer and a dielectric layer. The copper conductive layer includes via patterns and routing patterns, where each of the via patterns and the routing patterns includes a plurality of copper crystal grains. The plurality of copper crystal grains each include first banded structures having copper atoms oriented on a (220) lattice plane and second banded structures having copper atoms oriented on a (111) lattice plane, where a ratio of a number of the first banded structures to a number of the second banded structures is approximately less than or substantially equal to 0.4 and is approximately less than 1.0. The dielectric layer is disposed on the copper conductive layer and is at least partially overlapped with the via patterns and the routing patterns.

In accordance with some embodiments, a manufacturing method of package structure includes the following steps, providing at least one semiconductor die; encapsulating the at least one semiconductor die in an insulating encapsulation; forming a redistribution circuit structure on the semiconductor die, wherein the redistribution circuit structure is electrically connected to the semiconductor die, and forming the redistribution circuit structure comprises: forming a metallization layer having conductive patterns composed of columnar structures of copper crystal grains comprising first banded structures having copper atoms oriented on a (220) lattice plane; and depositing a dielectric layer at least partially covering the metallization layer; and disposing first conductive terminals on the redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
   a semiconductor die; and
   a redistribution circuit structure, disposed on and electrically connected to the semiconductor die, and comprising:
      a metallization layer having conductive patterns, wherein each of the conductive patterns comprises crystal grains each in a columnar shape and comprising a plurality of first banded structures having copper atoms oriented on a (220) lattice plane; and
      a dielectric layer, disposed on the metallization layer.

2. The package structure of claim 1, wherein the crystal grains each further comprises a plurality of second banded structures having copper atoms oriented on a (111) lattice plane.

3. The package structure of claim 2, wherein in each of the crystal grains, the plurality of first banded structures are stacked on the plurality of second banded structures along a stacking direction of the semiconductor die and the redistribution circuit structure, and wherein the crystal grains adjacent to each other are in physical contact with each other.

4. The package structure of claim 2, wherein each of the plurality of first banded structures has a first width and a first height less than the first width, and each of the plurality of second banded structures has a second width and a second height less than the second width, wherein the first width and the second width are measured along a direction perpendicular to the stacking direction, the first height and the second height are measured along the stacking direction.

5. The package structure of claim 2, wherein a ratio of a number of the plurality of first banded structures to a number of the plurality of second banded structures is approximately less than or substantially equal to 0.4 and is approximately less than 1.0.

6. The package structure of claim 1, wherein the redistribution circuit structure further comprises:
   a first metallic seed layer; and
   a second metallic seed layer, stacked on the first metallic seed layer along a stacking direction of the semiconductor die and the redistribution circuit structure,
   wherein the first metallic seed layer is located between the semiconductor die and the second metallic seed layer, and the second metallic seed layer is located between the first metallic seed layer and the metallization layer.

7. The package structure of claim 6, wherein along the stacking direction, a first thickness of the first metallic seed layer is less than or substantially equal to a second thickness of the second metallic seed layer.

8. The package structure of claim 1, wherein a grain size of the crystal grains is approximately ranging from 0.1 μm to 1.5 μm along a direction perpendicular to a stacking direction of the semiconductor die and the redistribution circuit structure.

9. The package structure of claim 1, further comprising:
   an insulating encapsulation, encapsulating the semiconductor die and located on the redistribution circuit structure; and
   first conductive terminals, located on and connected to the redistribution circuit structure, wherein the redistribution circuit structure is located between the insulating encapsulation and the first conductive terminals.

10. The package structure of claim 9, further comprising:
through vias, penetrating the insulating encapsulation and arranged aside of the semiconductor die, the through vias being electrically connected to the semiconductor die through the redistribution circuit structure; and
second conductive terminals, located on and connected to the through vias, wherein the insulating encapsulation is located between the redistribution circuit structure and the second conductive terminals.

11. A circuitry structure, comprising:
a copper conductive layer comprising via patterns and routing patterns, wherein each of the via patterns and the routing patterns comprises:
a plurality of copper crystal grains, each comprising first banded structures having copper atoms oriented on a (220) lattice plane and second banded structures having copper atoms oriented on a (111) lattice plane, wherein a ratio of a number of the first banded structures to a number of the second banded structures is approximately less than or substantially equal to 0.4 and is approximately less than 1.0; and
a dielectric layer, disposed on the copper conductive layer and at least partially overlapped with the via patterns and the routing patterns.

12. The circuitry structure of claim 11, wherein in each of the plurality of copper crystal grains, the first banded structures and the second banded structures are randomly stacked on each other in a columnar form along a stacking direction of the copper conductive layer and the dielectric layer, and wherein the plurality of copper crystal grains adjacent to each other are in physical contact with each other.

13. The circuitry structure of claim 12, wherein each of the first banded structures has a first width and a first height less than the first width, and each of the second banded structures has a second width and a second height less than the second width, wherein the first width and the second width are measured along a direction perpendicular to the stacking direction, the first height and the second height are measured along the stacking direction.

14. The circuitry structure of claim 11, wherein a ratio of a number of the first banded structures to a number of the second banded structures is approximately less than or substantially equal to 0.4 and is approximately less than 1.0.

15. The circuitry structure of claim 11, further comprising:
a seed layer, electrically coupled to the copper conductive layer and comprising:
a first metallic seed layer; and
a second metallic seed layer, sandwiched between the first metallic seed layer and the copper conductive layer, wherein the copper conductive layer is located between the second metallic seed layer and the dielectric layer,
wherein along a stacking direction of the first metallic seed layer, the second metallic seed layer, and the copper conductive layer, a first thickness of the first metallic seed layer is less than or substantially equal to a second thickness of the second metallic seed layer, and
wherein a thickness of the seed layer is approximately ranging from 0.1 kÅ to 12 kÅ as measured along the stacking direction.

16. A method of manufacturing a package structure, comprising:
providing at least one semiconductor die;
encapsulating the at least one semiconductor die in an insulating encapsulation;
forming a redistribution circuit structure on the at least one semiconductor die, wherein the redistribution circuit structure is electrically connected to the at least one semiconductor die, and forming the redistribution circuit structure comprises:
forming a metallization layer having conductive patterns composed of columnar structures of copper crystal grains comprising first banded structures having copper atoms oriented on a (220) lattice plane; and
depositing a dielectric layer at least partially covering the metallization layer; and
disposing first conductive terminals on the redistribution circuit structure.

17. The method of claim 16, wherein in a step of forming the metallization layer, the copper crystal grains each are formed to further comprise second banded structures having copper atoms oriented on a (111) lattice plane, wherein a ratio of a number of the first banded structures to a number of the second banded structures is approximately less than or substantially equal to 0.4 and is approximately less than 1.0.

18. The method of claim 16, wherein prior to forming the metallization layer, the method further comprises:
forming a first metallic seed layer on the insulating encapsulation; and
forming a second metallic seed layer on the first metallic seed layer, wherein the second metallic seed layer is located between the first metallic seed layer and the metallization layer, and a first thickness of the first metallic seed layer is less than or substantially equal to a second thickness of the second metallic seed layer.

19. The method of claim 16, wherein forming the metallization layer comprises performing an electroplating process with a plating solution comprising:
an electrolyte; and
an additive comprising a compound represented by a chemical formula below:

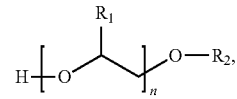

wherein:
$R_1$ and $R_2$ independently are selected from a group consisting of a substituted or unsubstituted aromatic group and a substituted or unsubstituted hetero aromatic group, and
n is an integer of 5 to 250.

20. The method of claim 19, prior to encapsulating the at least one semiconductor die, further comprising:
forming through vias arranged aside of the at least one semiconductor die, wherein the through vias electrically connected to the at least one semiconductor die through the redistribution circuit structure,
wherein encapsulating the at least one semiconductor die further comprises encapsulating the through vias in the insulating encapsulation.

* * * * *